United States Patent
Tanaka et al.

(10) Patent No.: US 7,691,713 B2
(45) Date of Patent: Apr. 6, 2010

(54) METHOD OF MANUFACTURING SEMICONDUCTOR DEVICE CAPABLE OF SUPPRESSING IMPURITY CONCENTRATION REDUCTION IN DOPED CHANNEL REGION ARISING FROM FORMATION OF GATE INSULATING FILM

(75) Inventors: Yoshinori Tanaka, Tokyo (JP); Katsuyuki Horita, Tokyo (JP); Heiji Kobayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 449 days.

(21) Appl. No.: 11/767,734

(22) Filed: Jun. 25, 2007

(65) Prior Publication Data

US 2007/0243687 A1   Oct. 18, 2007

Related U.S. Application Data

(62) Division of application No. 11/292,360, filed on Dec. 2, 2005, now Pat. No. 7,244,655, which is a division of application No. 10/730,099, filed on Dec. 9, 2003, now Pat. No. 6,998,319.

(30) Foreign Application Priority Data

May 21, 2003 (JP) ............................. 2003-143438

(51) Int. Cl.
H01L 21/336 (2006.01)
(52) U.S. Cl. ..................... 438/302; 438/531
(58) Field of Classification Search ................ 438/302, 438/369, 370, 450, 505, 506, 527, 531, 551, 438/736; 257/E21.654
See application file for complete search history.

(56) References Cited

U.S. PATENT DOCUMENTS

| 4,597,824 | A | 7/1986 | Shinada et al. |
| 5,364,810 | A | 11/1994 | Kosa et al. |
| 5,677,217 | A | 10/1997 | Tseng |
| 2002/0011644 | A1 | 1/2002 | Lee |

(Continued)

FOREIGN PATENT DOCUMENTS

DE        103 34 101 A1      2/2004

(Continued)

*Primary Examiner*—David Vu
(74) *Attorney, Agent, or Firm*—Oblon, Spivak, McClelland, Maier & Neustadt, L.L.P.

(57) ABSTRACT

A method of manufacturing a semiconductor device is provided that can suppress impurity concentration reduction in a doped channel region arising from formation of a gate insulating film. With a silicon oxide film (20) and a silicon nitride film (21) being formed, p-type impurity ions ($23.sub.1$, $23.sub.2$) are implanted in a Y direction from diagonally above. As for an implant angle .alpha. of the ion implantation, an implant angle is adopted that satisfies the relationship $\tan^{-1}(W2/T) < \alpha \leq \tan^{-1}(W1/T)$, where W1 is an interval between a first portion ($21_1$) and a fourth portion ($21_4$) and an interval between a third portion ($21_3$) and a sixth portion ($21_6$); W2 is an interval between a second portion ($21_2$) and a fifth portion ($21_5$); T is a total film thickness of the silicon oxide film (20) and the silicon nitride film (21). When the implant angle α is controlled within that range, impurity ions ($23_1$, $23_1$) are implanted into a second side surface ($10A_2$) and a fifth side surface ($10A_5$) through a silicon oxide film (13).

4 Claims, 33 Drawing Sheets

U.S. PATENT DOCUMENTS

2004/0124491 A1 * 7/2004 Yamashita et al. .......... 257/506
2004/0209431 A1 10/2004 Oyu et al.

FOREIGN PATENT DOCUMENTS

| JP | 8-250583 | 9/1996 |
| JP | 9-237829 | 9/1997 |
| JP | 10-65153 | 3/1998 |
| JP | 2002-261247 | 9/2002 |
| JP | 2002-299475 | 10/2002 |

* cited by examiner

F I G . 4
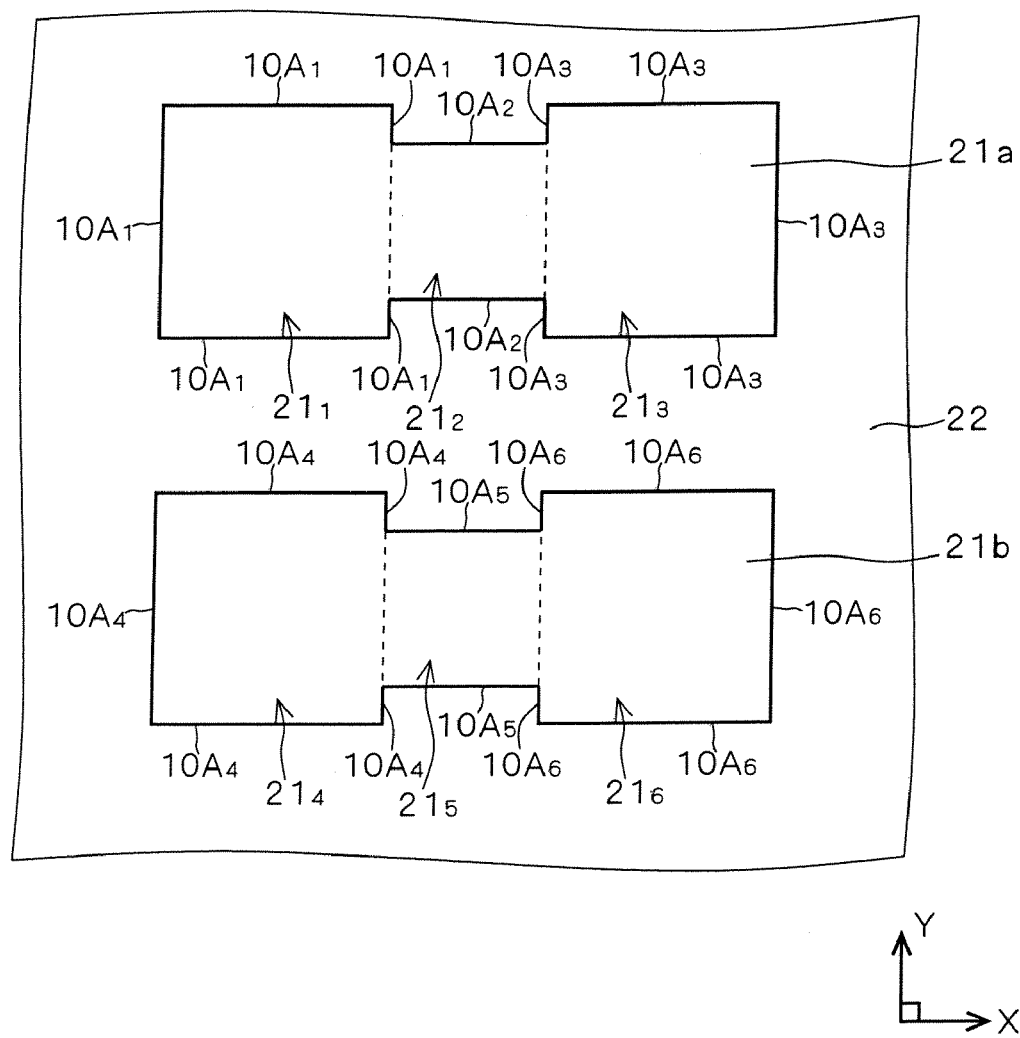

METHOD OF MANUFACTURING SEMICONDUCTOR DEVICE CAPABLE OF SUPPRESSING IMPURITY CONCENTRATION REDUCTION IN DOPED CHANNEL REGION ARISING FROM FORMATION OF GATE INSULATING FILM

CROSS-REFERENCE TO RELATED APPLICATIONS

This application is a divisional of U.S. application Ser. No. 11/292,360 filed Dec. 2, 05, which is a divisional of U.S. application Ser. No. 10/730,099 filed Dec. 9, 03 now U.S. Pat. No. 6,998,319 of which is hereby incorporated by reference. This application is based upon and claims the benefit of priority from the prior Japanese patent application No. 2003-143438 filed May 21, 2003, the disclosure of which is hereby incorporated by reference.

BACKGROUND OF THE INVENTION

1. Field of the Invention

The present invention relates to methods of manufacturing semiconductor devices, and more particularly to a method of manufacturing a semiconductor device having a DRAM capacitor.

2. Description of the Background Art

A conventional method of manufacturing a semiconductor device having a DRAM capacitor has the following steps, which are carried out in the following order: (a) partially forming an element isolating insulation film in an upper surface of a silicon substrate, (b) ion-implanting an impurity in a direction perpendicular to the upper surface of the silicon substrate to form a doped channel region, a channel cut region, and a well region, all of which are of p-type, within the silicon substrate that is in an element forming region, (c) forming a gate insulating film on the upper surface of the silicon substrate that is within the element forming region using a thermal oxidation technique, (d) forming a gate electrode on the gate insulating film, (e) forming a source region and a drain region, both of which are of n-type, in the upper surface of the silicon substrate, the source region and drain region forming a pair such as to sandwich a channel forming region below the gate electrode, (f) forming a first interlayer dielectric film entirely, (g) forming a first contact plug connected to the drain region in the first interlayer dielectric film, (h) forming a bit line connected to the first contact plug, (i) forming a second interlayer dielectric film entirely, (j) forming a second contact plug connected to the source region in the first and second interlayer dielectric films, (k) forming a third interlayer dielectric film entirely, (j) forming a capacitor lower electrode connected to the second contact plug in the third interlayer dielectric film, (m) forming a capacitor dielectric film on the capacitor lower electrode, and (n) forming a capacitor upper electrode on the capacitor dielectric film.

Japanese Patent Application Laid-Open Nos. 10-65153, 9-237829, and 8-250583, for example, disclose methods of manufacturing a semiconductor device including the step of forming a doped channel region in a silicon substrate.

According to the conventional methods of manufacturing a semiconductor device, however, the gate insulating film is formed after the doped channel region is formed. For this reason, part of the impurity contained in the doped channel region is absorbed into the gate insulating film by the heat treatment for forming the gate insulating film. As a result, the impurity concentration of the doped channel region becomes lower than a desired value, thereby reducing the threshold voltage of a memory cell transistor. This tendency is particularly noticeable in a boundary portion between the element isolating insulation film and the doped channel region, and a considerable reduction in the threshold voltage of memory cell transistors occurs when the width of the doped channel region becomes narrower than a certain value (the phenomenon known as "inverse narrow width effect").

It is possible to compensate the reduction in the impurity concentration by ion-implanting a p-type impurity at a higher concentration than a desired value when forming doped channel regions. However, since the high-concentration p-type impurity is implanted into the regions in which n-type source and drain regions are to be formed, the following problems arise.

Because the impurity concentration in the source and drain regions reduces, the contact resistance between the source region and the second contact plug increases. As a consequence, the performance of memory cell transistors degrades, leading to the problem of deteriorating data write characteristics.

In addition, electric field strength becomes high in the boundary portion between the source region and the channel forming region and in the boundary portion between the source region and the element isolating insulation film. As a result, junction leakage current increases, leading to the problem of deteriorating device characteristics (for example, refresh characteristics) of DRAMs.

SUMMARY OF THE INVENTION

IT IS Therefore an object of the present invention to provide a method of manufacturing a semiconductor device that is capable of suppressing reduction in a impurity concentration in a doped channel region, which is caused by formation of a gate insulating film, without deteriorating write characteristics and refresh characteristics.

According to a first aspect of the present invention, a method of manufacturing a semiconductor device includes the following steps (a) through (k). The step (a) is to form a first substantially H-shaped mask material and a second substantially H-shaped mask material on a main surface of a semiconductor substrate, the first mask material having a first portion, a second portion, and a third portion connected in that order along a first direction in plan view and wherein a dimension of the second portion with respect to a second direction in plan view that is perpendicular to the first direction is smaller than dimensions of the first and third portions with respect to the second direction, the second mask material having a fourth portion, a fifth portion, and a sixth portion connected in that order along the first direction and wherein a dimension of the fifth portion with respect to the second direction is smaller than dimensions of the fourth and sixth portions with respect to the second direction, so that the first and fourth portions, the second and fifth portions, and the third and sixth portions are each mutually spaced apart and aligned along the second direction. The step (b) is to etch the semiconductor substrate using the first and second mask materials as etch masks, to form in the main surface a recessed portion having a first side surface, a second side surface, and a third side surface that are defined by the semiconductor substrate below the first to third portions, and a fourth side surface, a fifth side surface, and a sixth side surface that are defined by the semiconductor substrate below the fourth to sixth portions. The step (c) is to implant impurity ions in the second direction from diagonally above, with the first and second mask materials being formed on the main surface, to form first doped channel regions of a first conductive type only in the second and fifth side surfaces among the first to sixth side surfaces. The step (d) is performed after the step (c). The step (d) is to form an element isolating insulation film by filling the recessed portion to define respective portions of the semiconductor substrate where the first and second mask materials are formed in the step (a) as a first element forming region and a second element forming region. The step (e) is to form second doped channel regions of the first conductive type respectively within the main surface that is in the first and second element forming regions. The step (f) is performed after the step (c). The step (f) is to remove the first and second mask materials. The step (g) is performed after the step (f). The step (g) is to form an insulating film on the main surface that is in the first and second element forming regions. The step (h) is to form a conductive film on a structure obtained by the step (g). The step (i) is to pattern the conductive film to form a gate electrode above the main surface on which the second and fifth portions are formed in the step (a), the gate electrode extending along the second direction. The step ( ) is to form first source-drain regions of a second conductive type being different from the first conductive type, in the main surface in which the first and fourth portions are formed in the step (a). The step (k) is to form second source-drain regions of the second conductive type in the main surface in which the third and sixth portions are formed in the step (a).

It is possible to suppress reduction in the impurity concentration in the doped channel regions, which arises from formation of the gate insulating film.

According to a second aspect of the present invention, a method of manufacturing a semiconductor device includes the following steps (a) through (k). The step (a) is to form a first mask material, a second mask material, and a third mask material on a main surface of a semiconductor substrate, the first mask material having a first portion, a second portion, and a third portion connected in that order along a first direction in plan view, the second mask material having a fourth portion, a fifth portion, and a sixth portion connected in that order along the first direction, and the third mask material having a seventh portion, an eighth portion, and a ninth portion connected in that order along the first direction, so that the third, fourth and ninth portions are mutually spaced apart and aligned in that order along a second direction in plan view that is perpendicular to the first direction, that the second and eighth portions are mutually spaced apart and aligned along the second direction, and that the second and fifth portions are not aligned along the second direction. The step (b) is to etch the semiconductor substrate using the first to third mask materials as an etch mask to form in the main surface a recessed portion having a first side surface, a second side surface, and a third side surface that are defined by the semiconductor substrate below the first to third portions, respectively, a fourth side surface, a fifth side surface, and a sixth side surface that are defined by the semiconductor substrate below the fourth to sixth portions, respectively, and a seventh side surface, an eighth side surface, and a ninth side surface that are defined by the semiconductor substrate below the seventh to ninth portions. The step (c) is to implant impurity ions in the second direction from diagonally above, with the first to third mask materials being formed on the main surface, to form first doped channel regions of a first conductive type only in the second side surface of the second and third side surfaces, only in the fifth side surface of the fourth and fifth side surfaces, and only in the eighth side surface of the eighth and ninth side surfaces. The step (d) is performed after the step (c). The step (d) is to form an element isolating insulation film by filling the recessed portion to define respective portions of the semiconductor substrate where the first to third mask materials are formed in the step (a) as a first element forming region, a second element forming region, and a third element forming region. The step (e) is to form second doped channel regions of the first conductive type within the main surface that is in the first to third element forming regions, respectively. The step (f) is performed after the step (c). The step (f) is to remove the first to third mask materials. The step (g) is performed after the step (f). The step (g) is to form an insulating film on the main surface that is in the first to third element forming regions. The step (h) is to form a conductive film on a structure obtained by the step (g). The step (i) is to pattern the conductive film to form a gate electrode above the main surface on which the second, fifth, and eighth portions are formed in the step (a), the gate electrode extending along the second direction. The step (j) is to form first source-drain regions of a second conductive type being different from the first conductive type, in the main surface in which the first, sixth, and seventh portions are formed in the step (a). The step (k) is to form second source-drain regions of the second conductive type in the main surface in which the third, forth, and ninth portions are formed in the step (a).

It is possible to suppress reduction in the impurity concentration in the doped channel regions, which arises from formation of the gate insulating film.

According to a third aspect of the present invention, a method of manufacturing a semiconductor device includes the following steps (a) through (e). The step (a) is to form an insulating film on a main surface of a semiconductor substrate. The step (b) is to form a conductive film on the insulating film. The step (c) is to implant ions of an impurity into the main surface through the conductive film and the insulating film to form doped channel regions. The step (d) is to pattern the conductive film to form a gate electrode. The step (e) is to introduce an impurity into the main surface that is exposed from the gate electrode to form source-drain regions.

It is possible to suppress reduction in the impurity concentration in the doped channel regions, which arises from formation of the gate insulating film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a top plan view showing a formation pattern of a silicon nitride film, corresponding to FIG. 1;

DESCRIPTION OF THE PREFERRED EMBODIMENTS

First Preferred Embodiment

Figure 1:
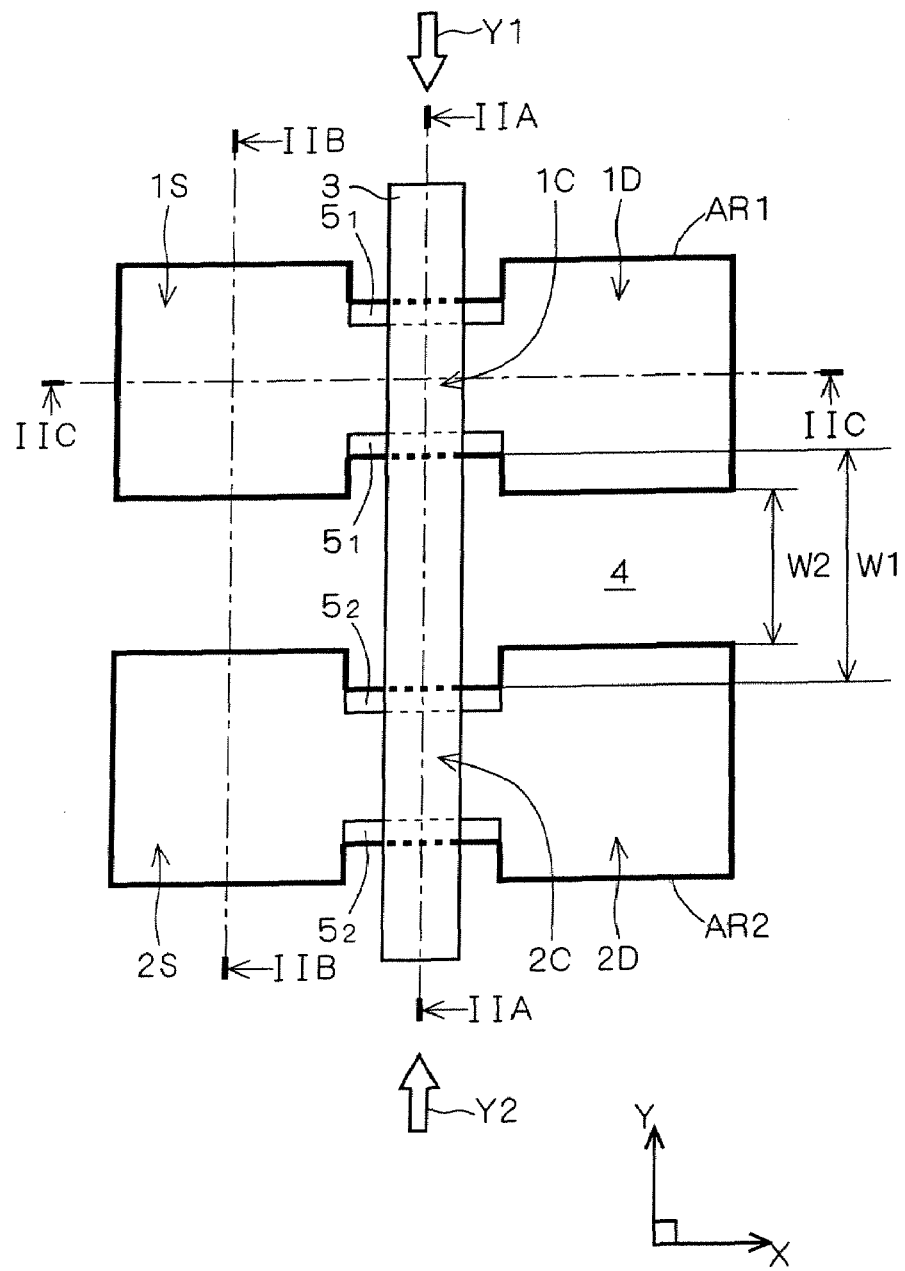
FIG. 1 is a top plan view showing a structure of a semiconductor device according to a first preferred embodiment of the present invention.

FIG. 1 is a top plan view showing a structure of a semiconductor device according to a first preferred embodiment of the present invention. Element forming regions AR1 and AR2 having a substantially H-shaped upper surface structure are defined by an element isolating insulation film 4. The element forming regions AR1 and AR2 are spaced apart from each other and aligned along a Y direction.

In the element forming region AR1, a first transistor is formed that has a source region 1S, a drain region 1D, a doped channel region 1C, and a gate structure 3. Likewise, in the element forming region AR2, a second transistor is formed that has a source region 2S, a drain region 2D, a doped channel region 2C, and the gate structure 3. In the example shown in FIG. 1, the gate structure 3 that the first transistor has and the gate structure 3 that the second transistor has are connected to each other. The first and second transistors are, for example, memory cell transistors of a DRAM, transistors constituting a peripheral circuit thereof, or transistors constituting a logic circuit thereof. In the following, an example in which the first and second transistors are both N-channel MOSFETs is described.

The source region 1S, the doped channel region 1C, and the drain region 1D are aligned in that order along an X direction. Likewise, the source region 2S, the doped channel region 2C, and the drain region 2D are aligned in that order along the X direction. The source region IS and the source region 2S, the doped channel region 1C and the doped channel region 2C, and the drain region 1D and the drain region 2D, are each mutually spaced apart and aligned along the Y direction. An interval W1 between the doped channel region 1C and the doped channel region 2C is wider than an interval W2 between the source region 1S and the source region 2S and the interval W2 between the drain region 1D and the drain region 2D.

Figure 2A:
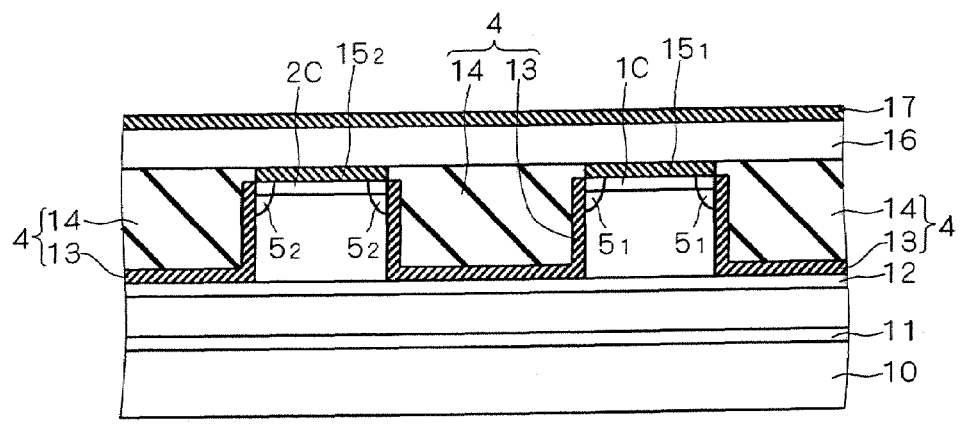
FIG. 2 is a cross-sectional view showing a cross-sectional structure of the semiconductor device shown in FIG. 1.
Figure 2B:
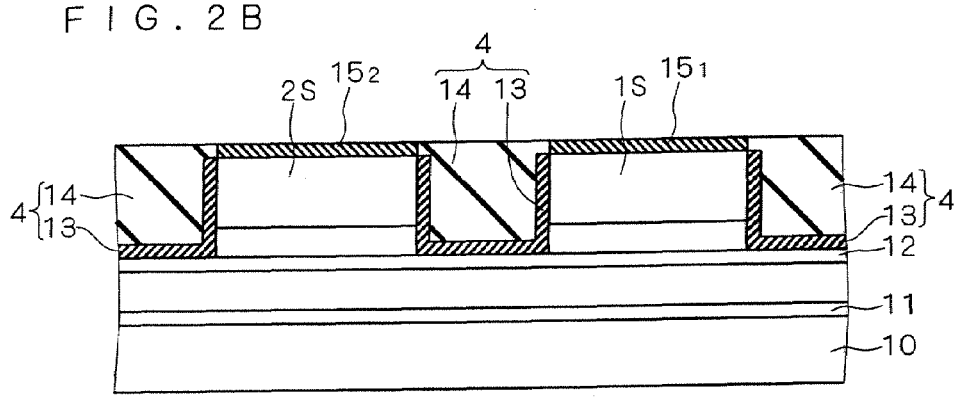
Figure 2C:
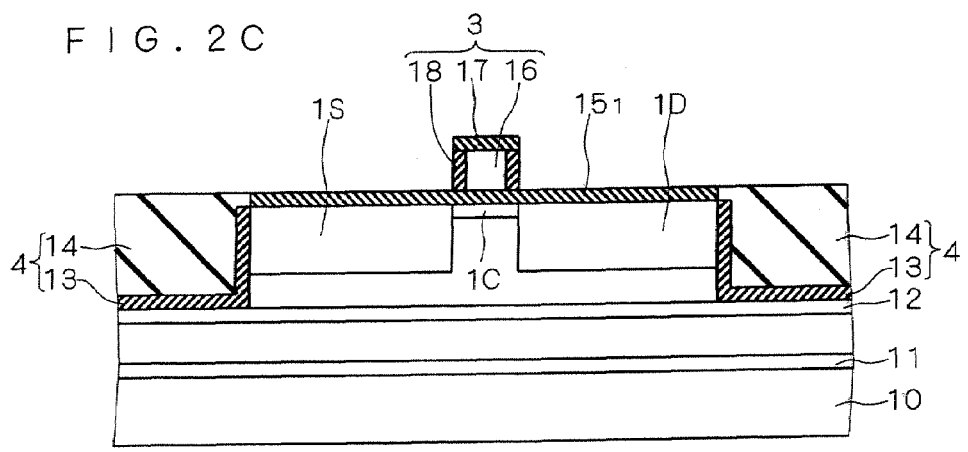

FIG. 2 depicts cross-sectional views showing a cross-sectional structure of the semiconductor device shown in FIG. 1. In FIG. 2, views (A), (B), and (C) show the cross-sectional structures taken along the lines IIA-IIA, IIB-IIB, and IIC-IIC shown in FIG. 1, respectively.

FIGS. 3 and 5 to 11 are cross-sectional views showing, in order of manufacturing steps, a method of manufacturing a semiconductor device according to the first preferred embodiment. The views (A) to (C) in each of the figures correspond to the views (A) to (C) of FIG. 2, respectively.

Figure 3A:
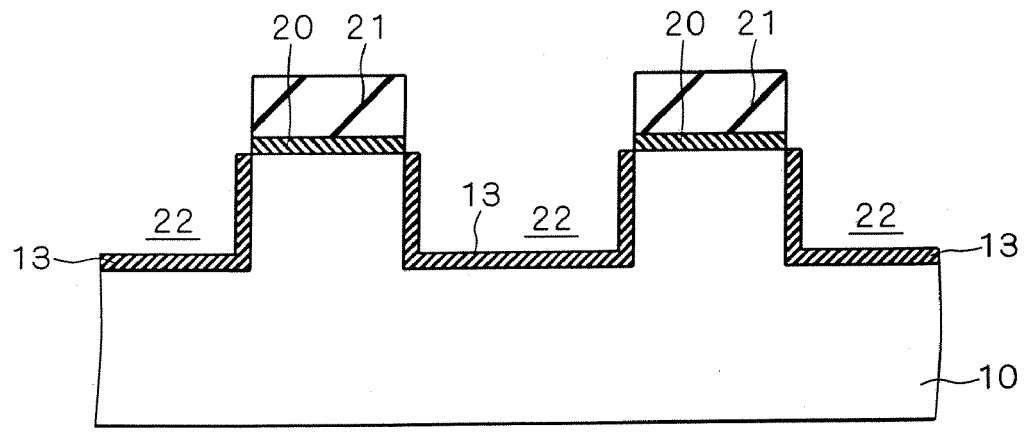
FIG. 3 is a cross-sectional view showing, in order of manufacturing steps, a method of manufacturing the semiconductor device according to the first preferred embodiment of the present invention.
Figure 3B:
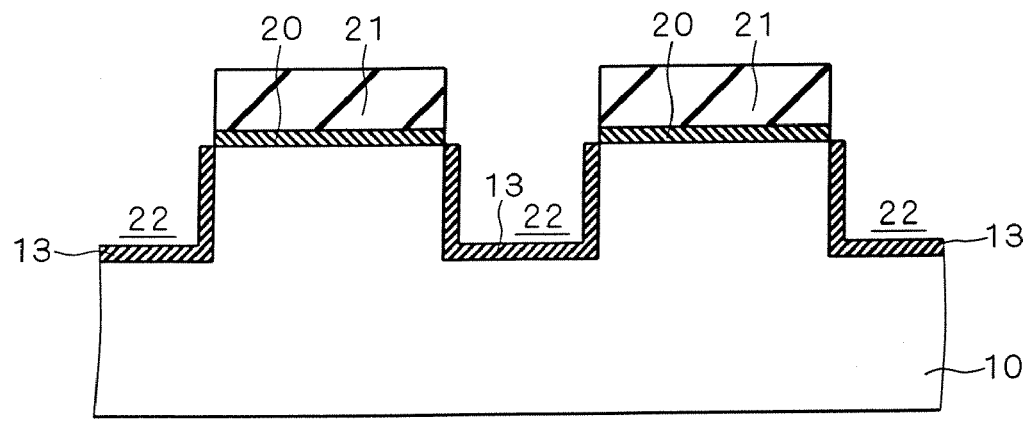
Figure 3C:
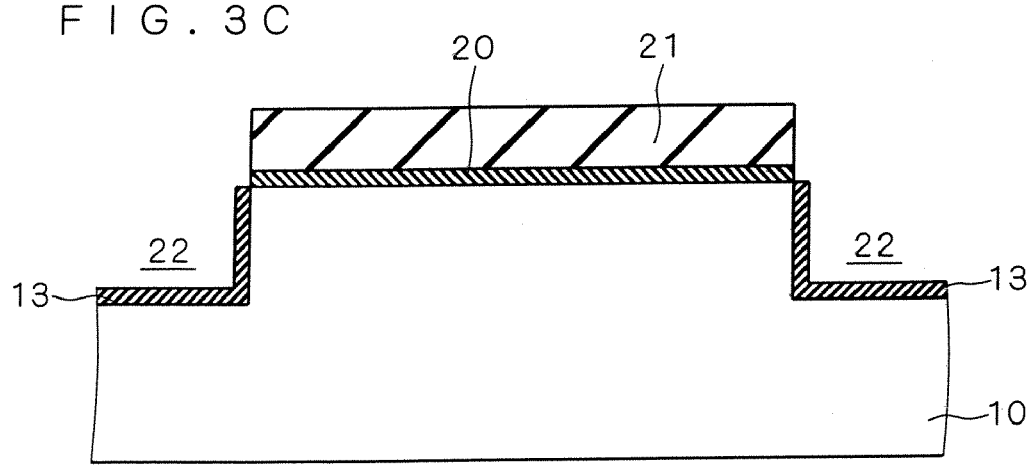

First, referring to FIG. 3, a silicon oxide film and a silicon nitride film are formed in that order entirely on an upper surface of an n-type silicon substrate 10. It should be noted, however, that a silicon oxynitride film may be formed in place of the silicon oxide film. Alternatively, in place of the silicon nitride film, a polysilicon film or a layered film of a silicon nitride film and a polysilicon film may be formed. Next, by patterning these films, a silicon oxide film 20 and a silicon nitride film 21 are formed. Subsequently, using the silicon nitride film 21 as an etch mask, the silicon substrate 10 is etched away by a predetermined film thickness using an anisotropic dry etching technique. This forms a recessed portion 22 in the upper surface of the silicon substrate 10. Then, using an oxidation furnace or a single wafer-type lamp oxidation apparatus, a silicon oxide film 13 having a film thickness of about several nanometers to several tens of nanometers is formed on the side surfaces and the bottom surface of the recessed portion 22 by a thermal oxidation technique at about 900 to 1150° C. This recovers crystal defects in the silicon substrate 10 that are produced by damages arising from the etching for forming the recessed portion 22.

FIG. 4 is a top plan view showing a formation pattern of the silicon nitride film 21 corresponding to FIG. 1. The silicon nitride film 21 that corresponds to the element forming region AR1 (denoted by reference character 21a in FIG. 4) has a first portion $21_1$, a second portion $21_2$, and a third portion $21_3$, which are connected in that order along the X direction. The silicon nitride film 21a has a substantially H-shaped upper surface structure, and the dimension of the second portion $21_2$ with respect to the Y direction is smaller than the dimensions of the first portion $21_1$ and the third portion $21_3$ with respect to the Y direction. Likewise, the silicon nitride film 21 that corresponds to the element forming region AR2 (denoted by reference character 21b in FIG. 4) has a fourth portion $21_4$, a fifth portion $21_5$, and a sixth portion $21_6$, which are connected in that order along the X direction. The silicon nitride film 21b has a substantially H-shaped upper surface structure, and the dimension of the fifth portion $21_5$ with respect to the Y direction is smaller than the dimensions of the fourth portion $21_4$ and the sixth portion $21_6$ with respect to the Y direction. The first portion $21_1$ and the fourth portion $21_4$, the second portion $21_2$ and the fifth portion $21_5$, and the third portion $21_3$ and the sixth portion $21_6$ are each mutually spaced apart and aligned along the Y direction. The recessed portion 22 has first to sixth side surfaces $10A_1$ to $10A_6$ defined by the silicon substrate 10 below the first to sixth portions $21_1$ to $21_6$.

Figure 5A:
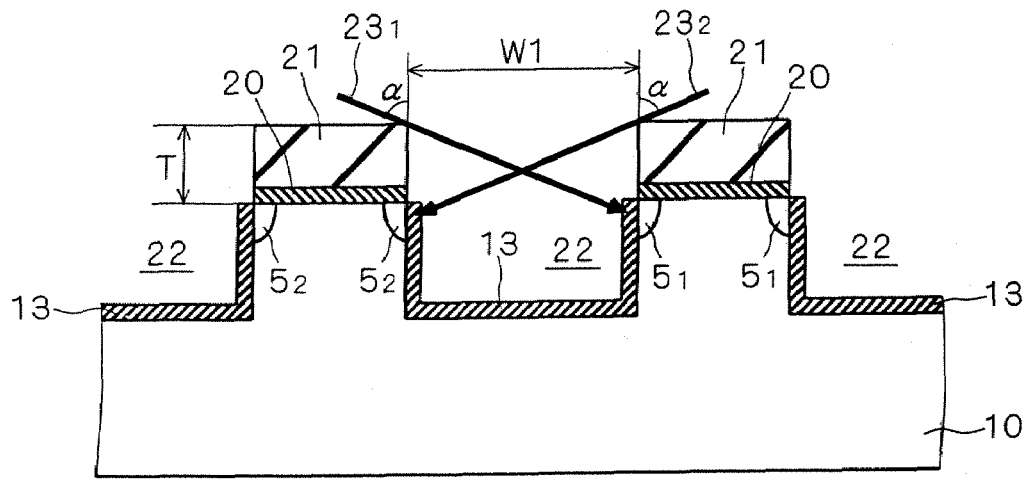
FIGS. 5 through 11 are cross-sectional views showing, in order of manufacturing steps, the method of manufacturing the semiconductor device according to the first preferred embodiment of the present invention.
Figure 5B:
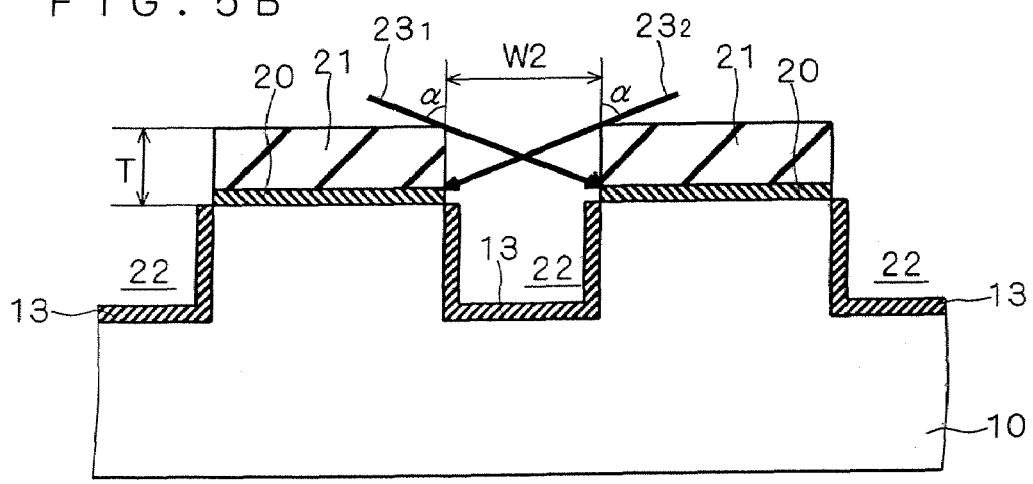
Figure 5C:
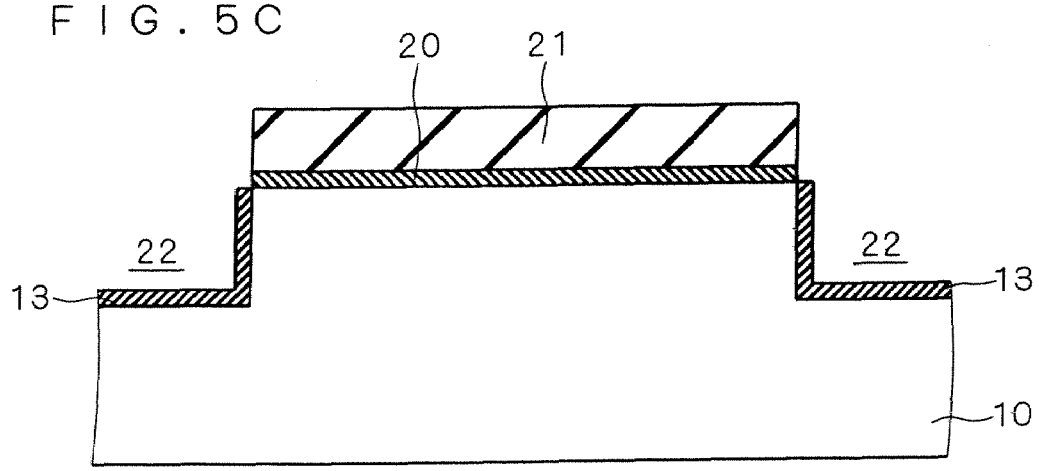

Subsequent to FIG. 3, referring to FIG. 5, ions $23_1$, $23_2$ of a p-type impurity such as B, $BF_2$, or In are implanted at a concentration of about 1 E11/cm$^2$ to 1 E14/cm$^2$ in the Y direction from diagonally above, with the silicon oxide film 20 and the silicon nitride film 21 having been formed. The ion implantation is sequentially carried out in opposing directions +Y and −Y, as indicated by arrows Y1 and Y2 in FIG. 1.

As for implant angle α of the ion implantation (that is, an angle formed by an implant direction of the impurity ions $23_1$ and $23_2$ and a direction of the normal to the upper surface of the silicon substrate 10), an implant angle is adopted that falls within a range that satisfies the relationship $\tan^{-1}(W2/T) < \alpha \leq \tan^{-1}(W1/T)$, where W2 represents an interval between the first portion $21_1$ and the fourth portion $21_4$ and an, internal between the third portion $21_3$ and the sixth portion $21_6$ shown in FIG. 4, W1 is an interval between the second portion $21_2$ and the fifth portion $21_5$, and T is a total film thickness of the silicon oxide film 20 and the silicon nitride film 21.

When the implant angle α is controlled within that range, the impurity ions $23_1$ and $23_2$ are implanted through the silicon oxide film 13 in the second side surface $10A_2$ and the fifth side surface $10A_5$ shown in FIG. 4. As a result, as shown in view (A) of FIG. 5, p-type doped channel regions $5_1$ and $5_2$ are formed within the upper surface of the silicon substrate 10 that is in the element forming regions AR1 and AR2, respectively. On the other hand, due to the shadowing effect of the silicon oxide film 20 and the silicon nitride film 21, the impurity ions $23_1$ and $23_2$ are not implanted to the first side surface $10A_1$, the third side surface $10A_3$, the fourth side surface $10A_4$, and the sixth side surface $10A_6$ that are shown in FIG. 4. As a result, as shown in view (B) of FIG. 5, the doped channel regions $5_1$ and $5_2$ are not formed.

Figure 6A:
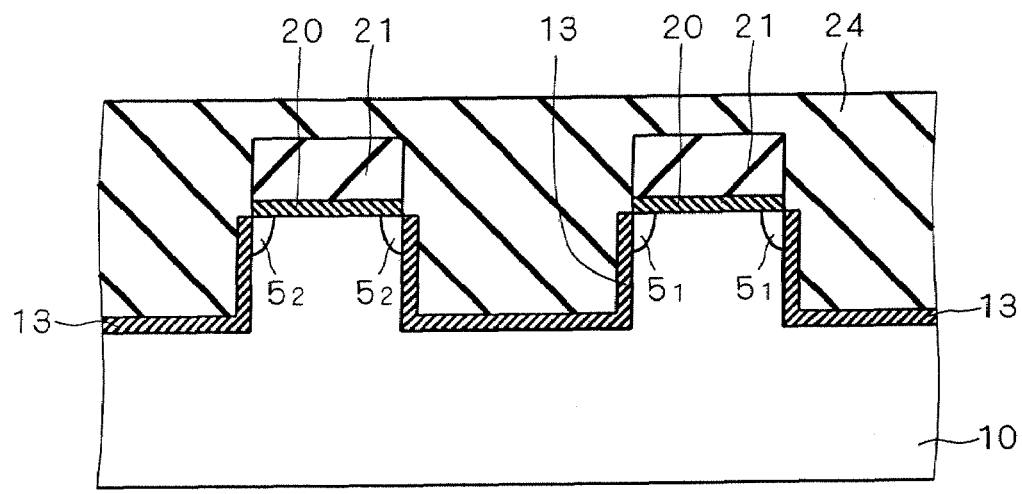
Figure 6B:
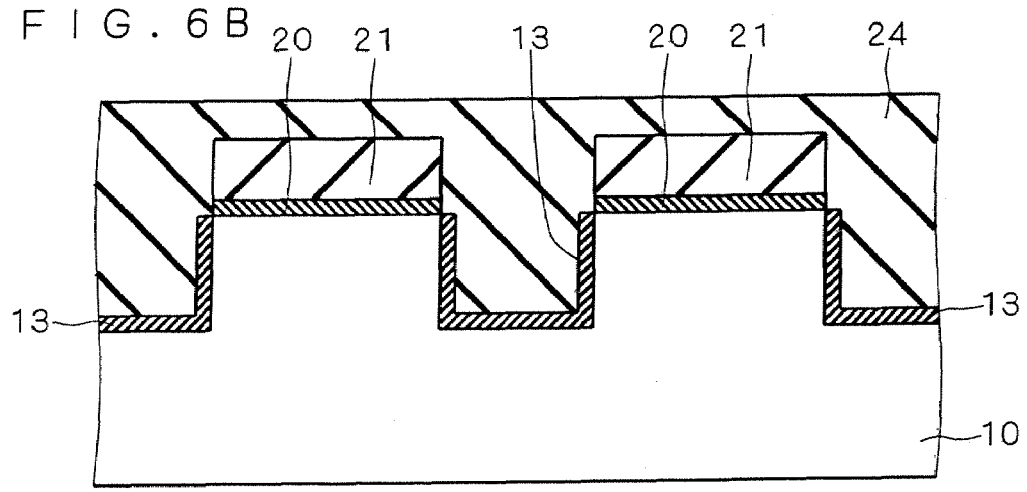
Figure 6C:
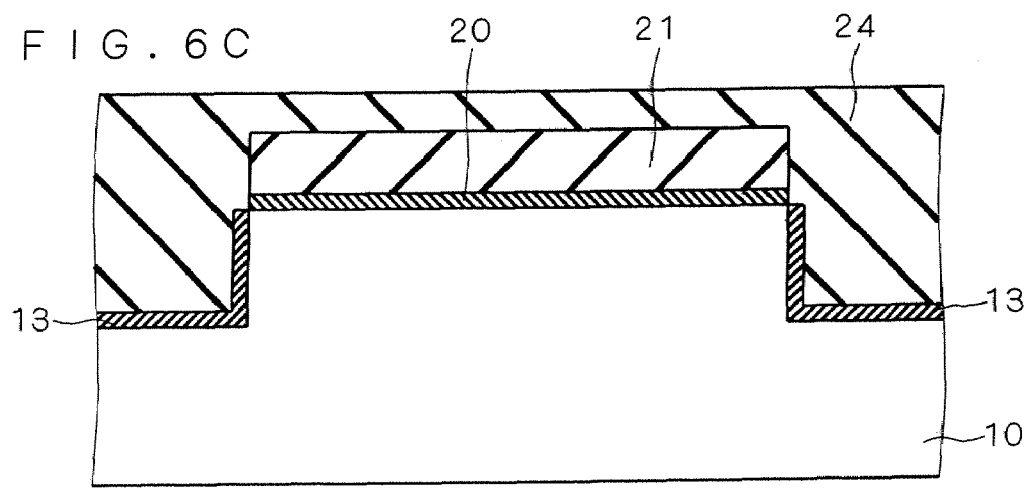

Next, referring to FIG. 6, a silicon oxide film 24 having such a film thickness that it can completely fill up the recessed portion 22 is entirely formed by a coating technique or a CVD technique using high density plasma. The silicon oxide film 24 may be doped with impurity such as F, P, or B.

Figure 7A:
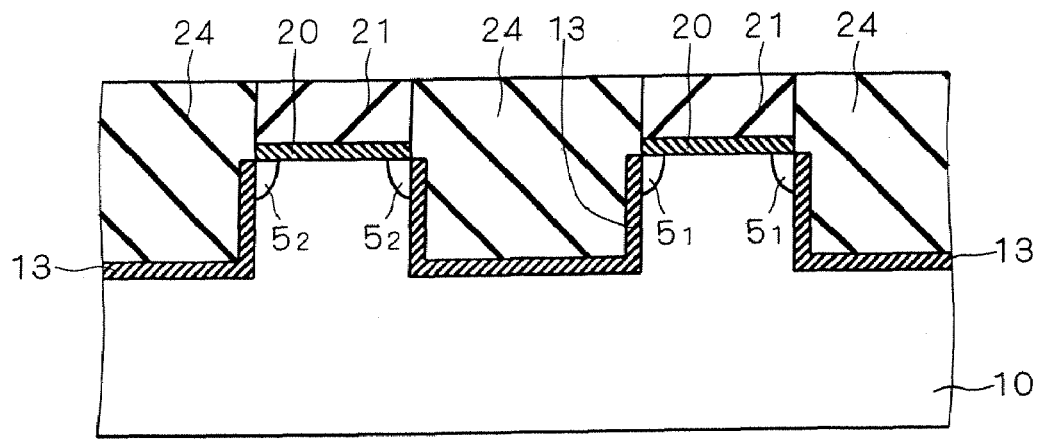
Figure 7B:
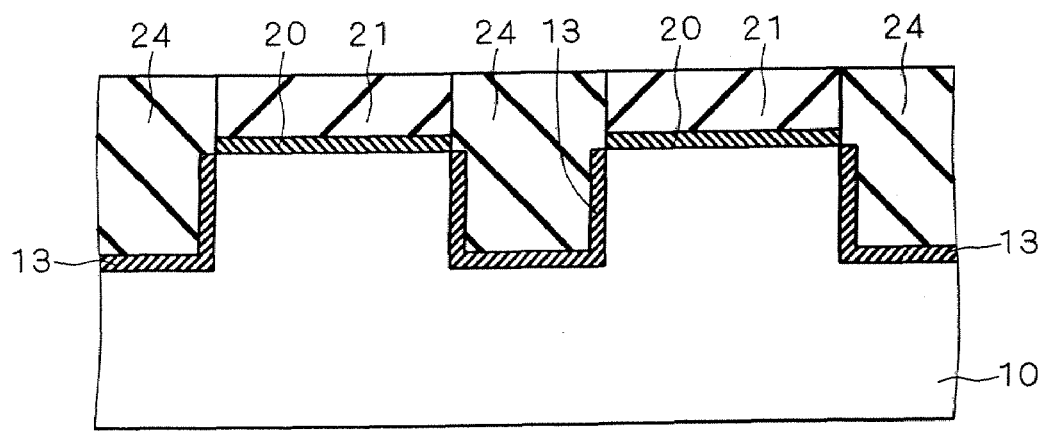
Figure 7C:
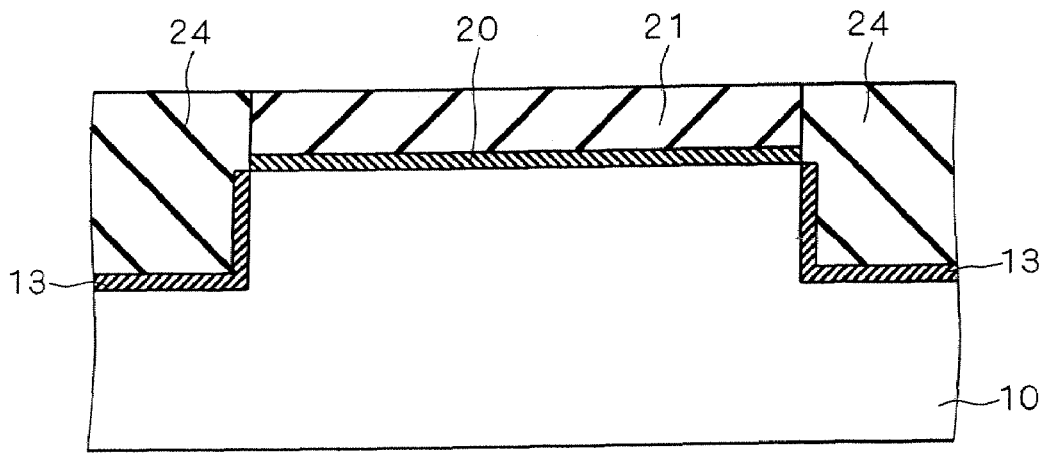

Then, referring to FIG. 7, the silicon oxide film 24 is polished by a CMP technique until an upper surface of the silicon nitride film 21 is exposed.

Subsequently, referring to FIG. 8, in order to adjust the height of an upper surface of the element isolating insulation film 4, the silicon oxide film 24 is removed by a desired film thickness using an aqueous solution of HF or the like. Next, the silicon nitride film 21 is removed using a hot phosphoric acid solution.

Figure 9A:
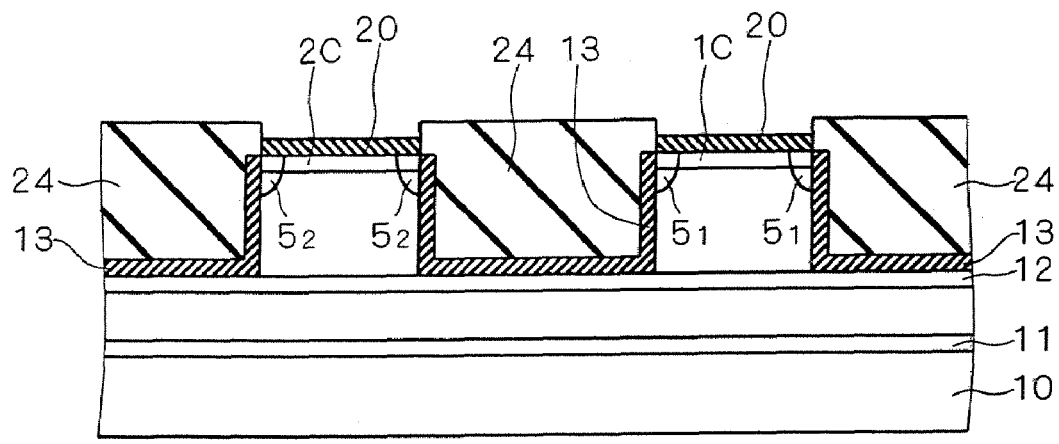
Figure 9B:
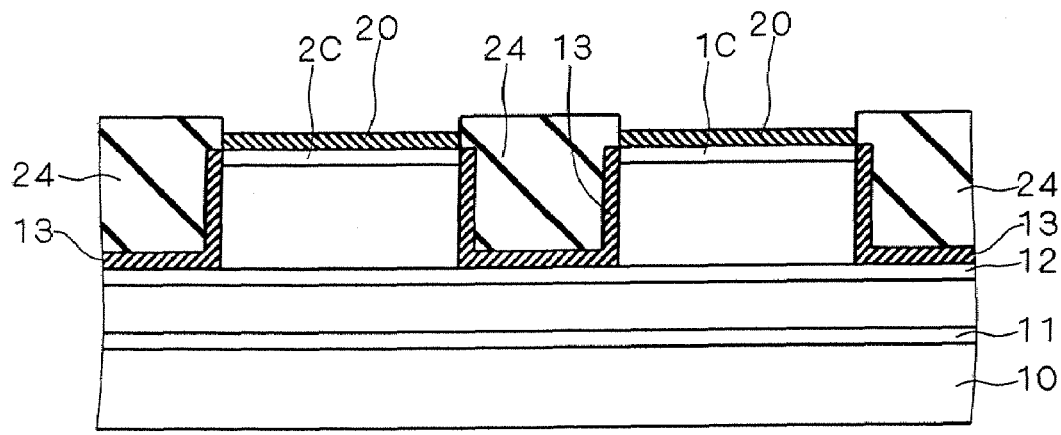
Figure 9C:
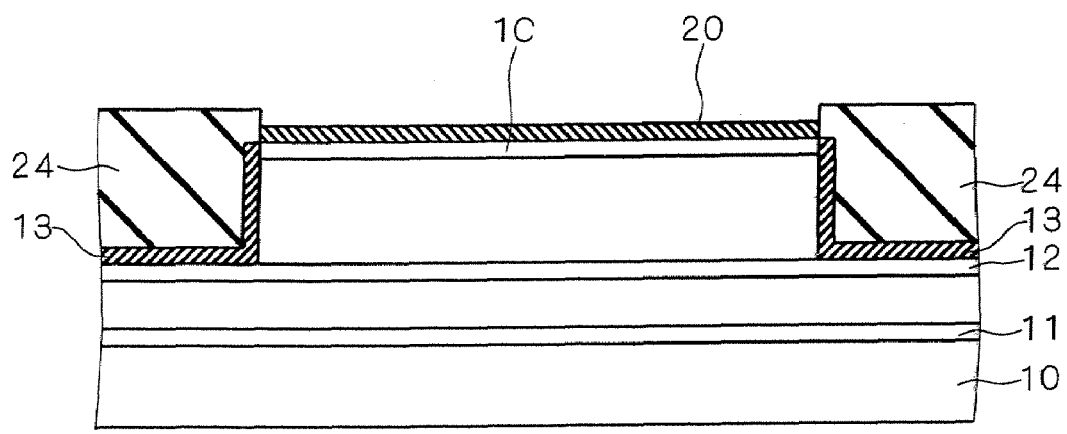

Then, referring to FIG. 9, in order to form a CMOS transistor, an impurity such as B is ion-implanted into the silicon substrate 10 through the silicon oxide film 20, thereby forming a p-type well region 11. Reference numeral 11 in FIG. 9 represents a location in which the impurity concentration shows a peak in the well region. Subsequently, in order to improve isolation breakdown voltage, a p-type channel cut region 12 is formed by ion-implanting an impurity such as B, $BF_2$, or In into the silicon substrate 10 through the silicon oxide film 20. Next, in order to adjust the threshold voltage of the transistors, an impurity such as B, $BF_2$, or In is ion-implanted at a concentration of about $1E11/cm^2$ to $1E14/cm^2$ into the silicon substrate 10 through the silicon oxide film 20. Thus, p-type doped channel regions 11C and 2C are formed in the upper surface of the silicon substrate 10. Thereafter, the impurities that have been ion-implanted in the silicon substrate 10 are activated by carrying out a heat treatment at about 800 to 1100° C. using a lamp annealing technique.

Figure 10A:
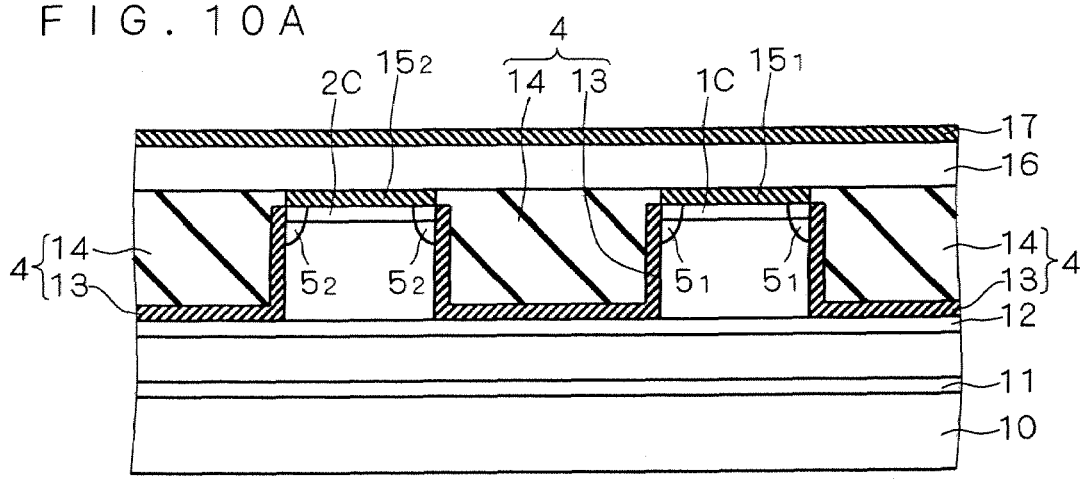
Figure 10B:
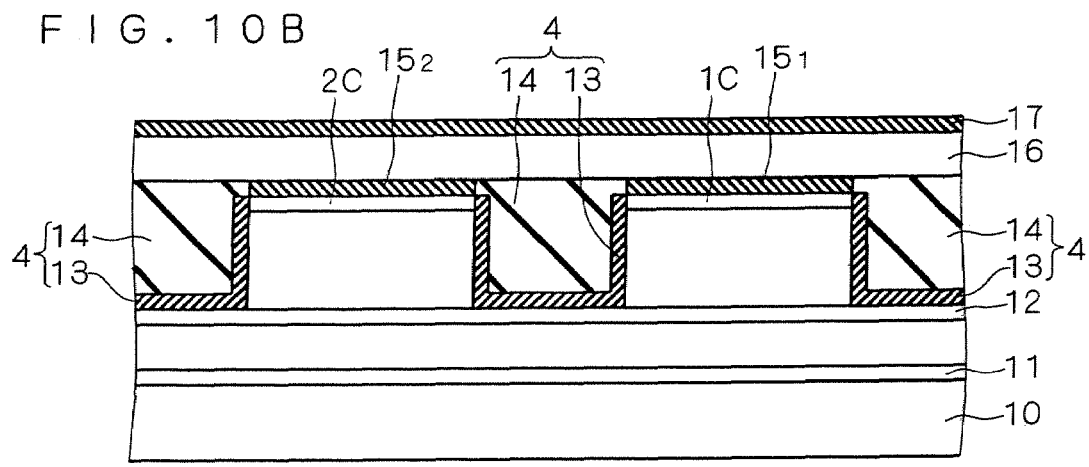
Figure 10C:
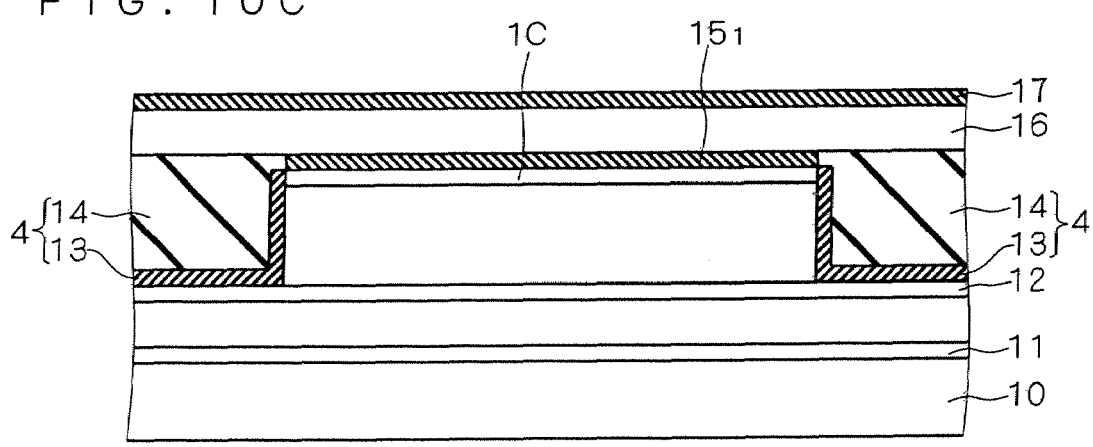

Next, referring to FIG. 10, the silicon oxide film 20 is removed using an aqueous solution of HF or the like. Thus, the upper surface of the silicon substrate 10 that is in the element forming regions AR1 and AR2 is exposed. Also, a portion of the silicon oxide film 24 is removed to form a silicon oxide film 14, thus forming a trench-shaped element isolating insulation film 4 having the silicon oxide films 13 and 14. Subsequently, using an oxidation furnace at about 700 to 850°, or a lamp oxidation apparatus at about 900 to 1100° C., silicon oxide films $15_1$ and $15_2$ functioning as gate insulating films are formed on the upper surface of the silicon substrate 10 that is in the element forming regions AR1 and AR2. It should be noted that a silicon oxynitride film, or a layered film of a silicon oxide film and a silicon oxynitride film may be formed in place of the silicon oxide films $15_1$ and $15_2$. Then, by a CVD technique or the like, a conductive film 16 is formed on the silicon oxide films $15_1$ and $15_2$ and on the element isolating insulation film 4. The conductive film 16 is a polysilicon film, a metal film (W, Ti, Al, Cu, or the like), a metal silicide film, a metal nitride film, or a layered film thereof. Next, using a CVD technique or the like, a silicon nitride film 17 is formed on the conductive film 16. It should be noted that a silicon oxide film, or a layered film of a silicon oxide film and a silicon nitride film may be formed in place of the silicon nitride film 17.

Figure 11A:
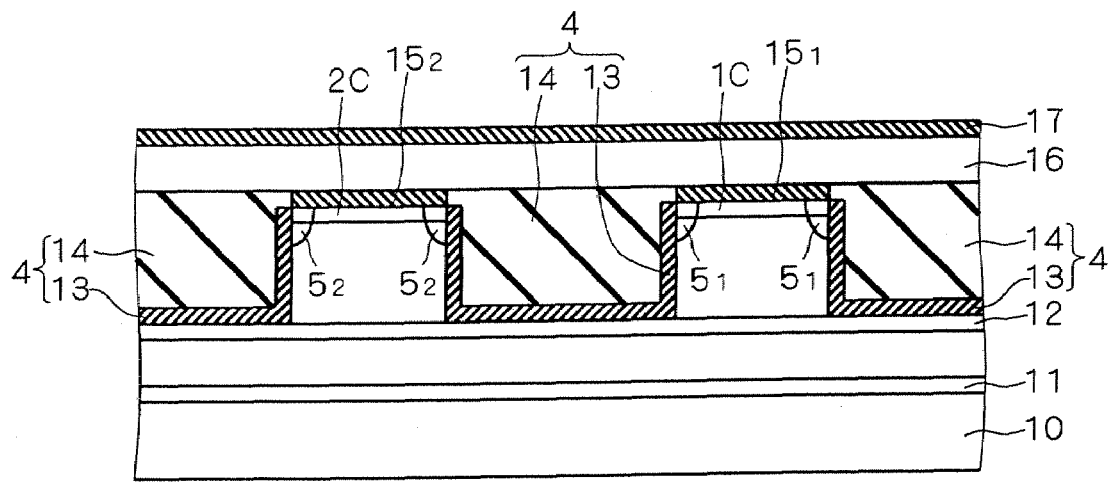
Figure 11B:
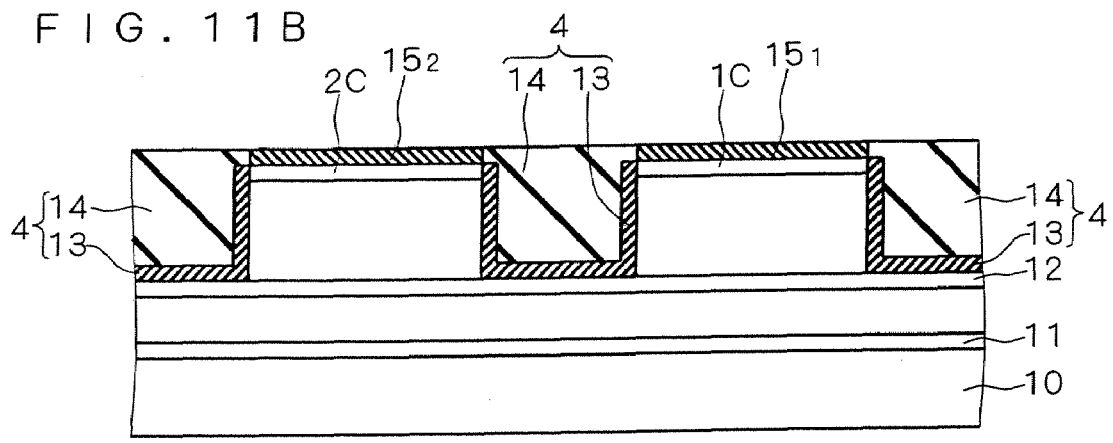
Figure 11C:
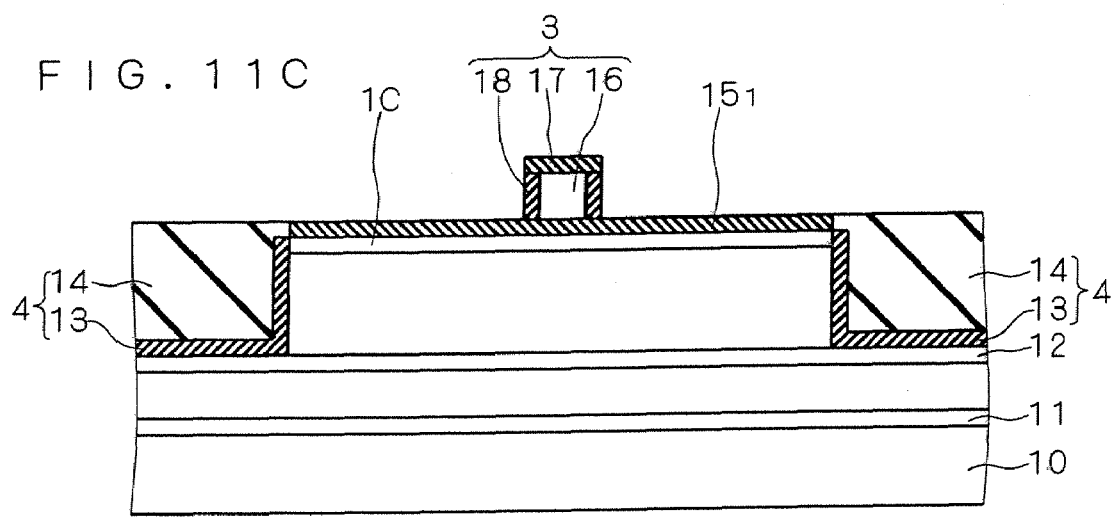

Next, referring to FIG. 11, the silicon nitride film 17 is patterned by a photolithography technique and an anisotropic dry etching technique. Then, using the silicon nitride film 17 as an etch mask, the conductive film 16 is etched by an anisotropic dry etching technique. The portion of the conductive film 16 that has not been etched away functions as a gate electrode. Next, using a lamp oxidation technique or a normal thermal oxidation technique, the conductive film 16 is oxidized or nitrided in a mixed gas atmosphere of $O_2$, NO, $N_2O$, $NH_3$, $H_2$, etc., to form an insulating film 18.

Subsequently, using the silicon nitride film 17 as an implant mask, an impurity such as P, As, or Sb is ion-implanted so as to form n-type source regions 1S and 2S and n-type drain regions 1D, 2D in the upper surfaces of the silicon substrate 10. With the manufacturing steps thus described, the structure shown in FIG. 2 is obtained.

As described above, in the method of manufacturing the semiconductor device according to the first preferred embodiment, the silicon oxide films $15_1$ and $15_2$, which function as the gate insulating films, are formed in the step shown in FIG. 10, after the doped channel regions $5_1$ and $5_2$ are formed in the step shown in FIG. 5 and then the doped channel regions 1C and 2C are formed in the step shown in FIG. 9. Therefore, even if part of the impurity contained in the doped channel regions $5_1$, $5_2$, 1C and 2C are absorbed in the gate insulating films because of the heat treatment for forming the gate insulating films, it is possible to suppress reduction in the impurity concentration in the doped channel regions in comparison with the conventional manufacturing methods in which the doped channel regions $5_1$ and $5_2$ are not formed. As a consequence, reduction in the threshold voltages of the first and second transistors can be suppressed.

Moreover, as shown in FIG. 1, the doped channel regions $5_1$ and $5_2$ are formed under the gate structure 3 and in the boundary portions between the element isolating insulation film 4 and the doped channel regions 1C and 2C; therefore, the inverse narrow width effect is effectively prevented from occurring.

Furthermore, in the step shown in FIG. 5, the p-type impurity ions $23_1$, $23_2$ are implanted in the Y direction from diagonally above, and in addition, the implant angle .alpha. of the ion implantation is controlled within the range $\tan^{-1}(W2/T) < \alpha \leq \tan^{-1}(W1/T)$; therefore, of the first to sixth side surfaces $10A_1$ to $10A_6$ shown in FIG. 4, only in the second side surface $10A_2$ and the fifth side surface $10A_5$, the doped channel regions $5_1$ and $5_2$ are formed in a self-aligned manner. Consequently, reduction in the impurity concentrations in the n-type source regions 1S and 2S as well as the drain regions 1D and 2D because of the formation of the p-type doped channel regions $5_1$ and $5_2$ can be appropriately avoided.

Second Preferred Embodiment

The second preferred embodiment describes an example in which the invention according to the foregoing first preferred embodiment is applied to DRAM memory cells.

Figure 12:
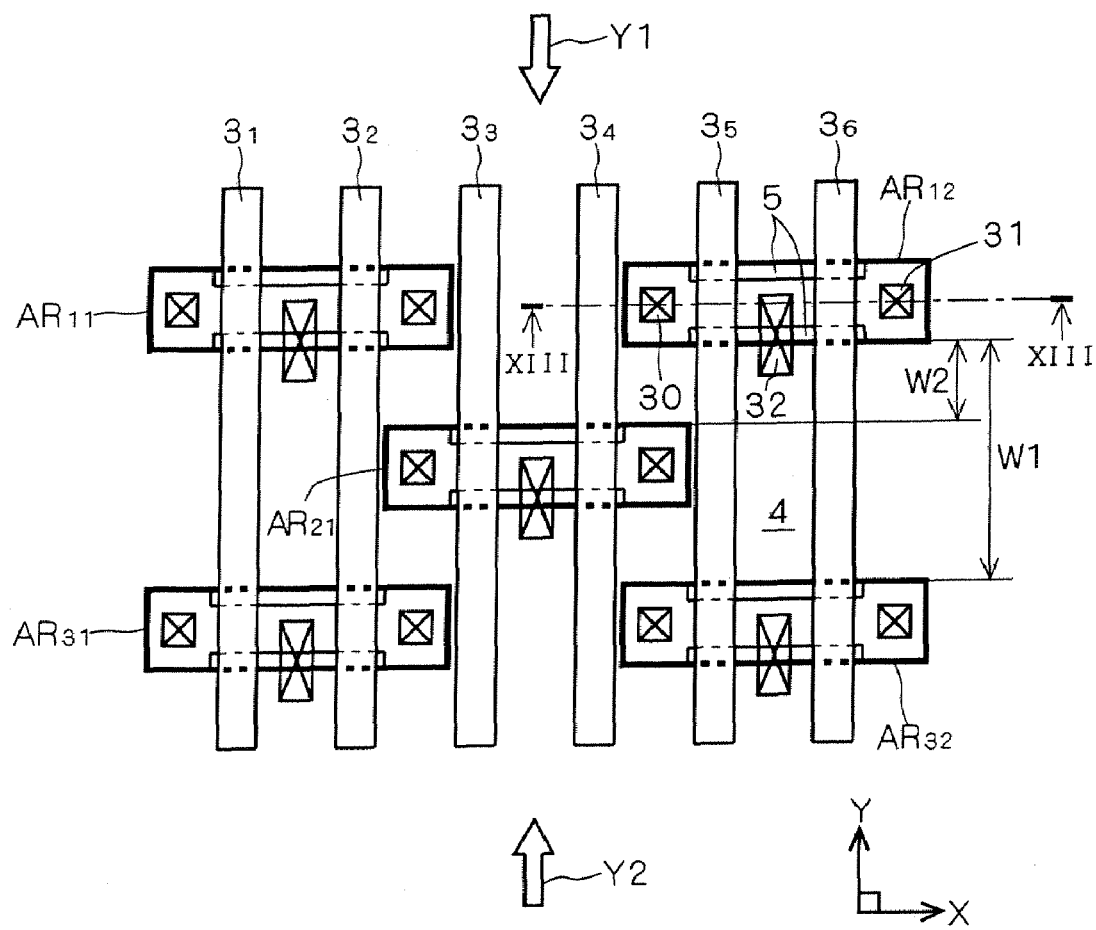
FIG. 12 is a top plan view showing a structure of a semiconductor device according to a second preferred embodiment of the present invention.
Figure 13:
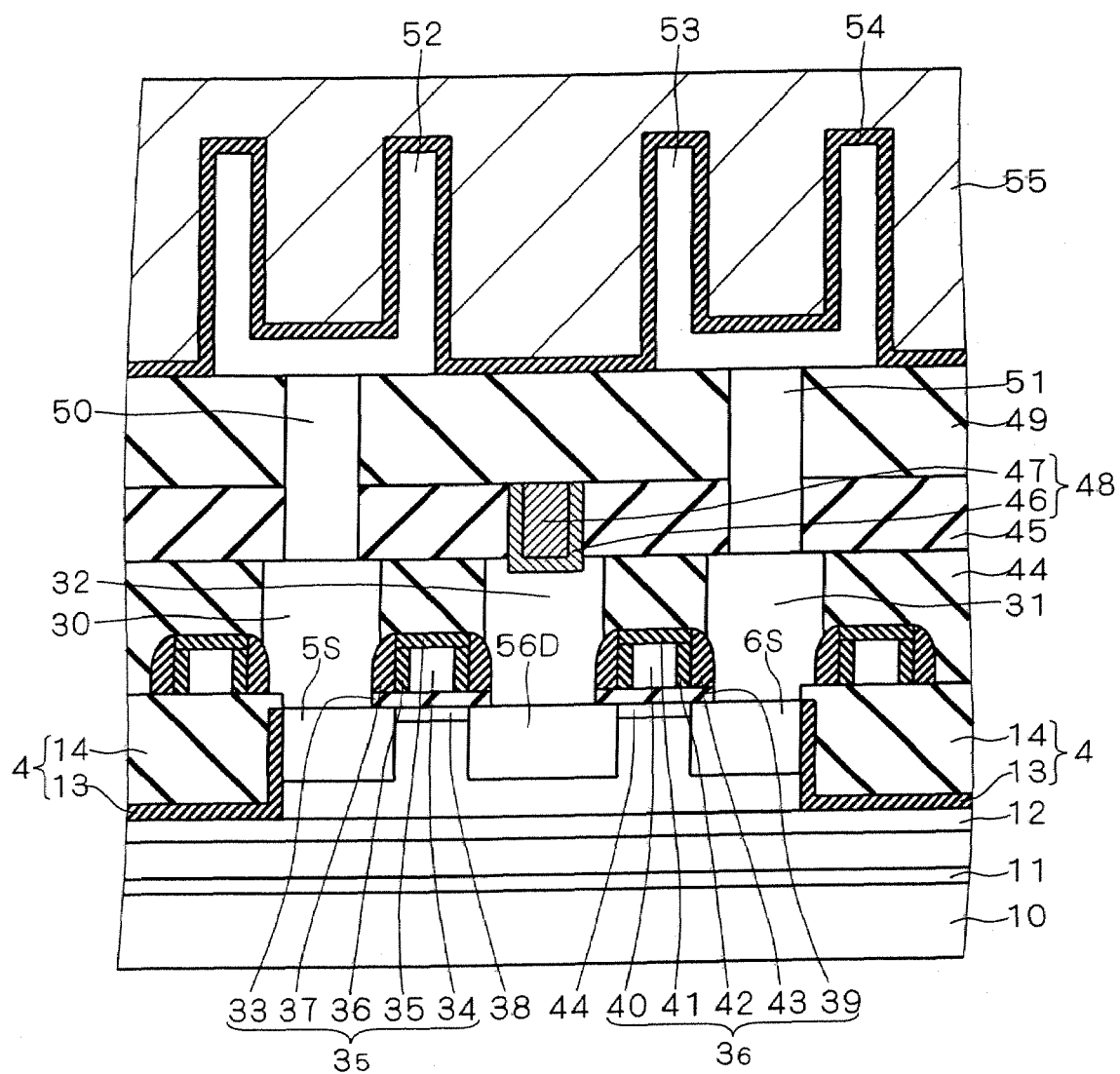
FIG. 13 is a cross-sectional view showing a cross-sectional structure concerning a position along the line XIII-XIII shown in FIG. 12.

FIG. 12 depicts a top plan view showing a structure of a semiconductor device according to a second preferred embodiment of the present invention. FIG. 13 depicts a cross-sectional view showing a cross-sectional structure concerning a position along the line XIII-XIII shown in FIG. 12. Referring to FIG. 12, a plurality of element forming regions AR (represented by reference characters $AR_{11}$, $AR_{12}$, $AR_{21}$, $AR_{31}$, and $AR_{32}$ in FIG. 12) are defined by the element isolating insulation film 4. The element forming region $AR_{11}$ and the element forming region $AR_{31}$ both of which belong to a common column in a memory cell array, and the element forming region $AR_{12}$ and the element forming region $AR_{32}$, both of which belong to another common column, are each mutually spaced apart and aligned along the Y direction. The element forming region $AR_{11}$ and the element forming region $AR_{12}$, both of which belong to a common row, and the element forming region $AR_3$, and the element forming region $AR_{32}$, both of which belong to a common row, are each mutually spaced apart and aligned along the X direction. The element forming region $AR_{21}$ is formed so that it is staggered with respect to the element forming region $AR_{11}$ by half of the formation pitch of the element forming regions AR along the X direction. That is, a so-called half pitch cell is constructed.

Referring to FIGS. 12 and 13, in each one of the element forming regions AR, two memory cell transistors are formed sharing a drain region 56D. On the drain region 56D, a contact plug 32 is formed that is connected to a bit line 48. Contact plugs 30 and 31 respectively connected to polysilicon films 52 and 53, which function as capacitor lower electrodes, are formed on respective source regions 5S and 6S. Since the half pitch cell is constructed, the source regions 5S and 6S formed in the element forming regions AR that belong to different rows are mutually spaced apart at an interval W2 and aligned along the Y direction. The drain regions 56D as well as doped channel regions 38, 44 formed in the element forming regions AR that belong to different rows are mutually spaced apart at an interval W1 that is wider than the interval W2 and aligned along the Y direction.

In each of the element forming regions AR, doped channel regions 5, which correspond to the doped channel regions $5_1$ and $5_2$ of the foregoing first preferred embodiment, are formed. As in the step shown in FIG. 5, the doped channel regions 5 are formed by implanting p-type impurity ions $23_1$, $23_2$ in the Y direction from diagonally above so that an implant angle α of the ion implantation controlled within a range $\tan^{-1}(W2/T) < \alpha \leq \tan^{-1}(W1/T)$. Thus, the doped channel regions 5 are formed in the doped channel regions 38 and 44 and in the drain region 56D, but are not formed in the source regions 5S and 6S. In the second preferred embodiment, for one example, the interval W1 is about 370 nm, the interval W2 is about 110 nm, and the film thickness T is about 120 nm.

Figure 15:
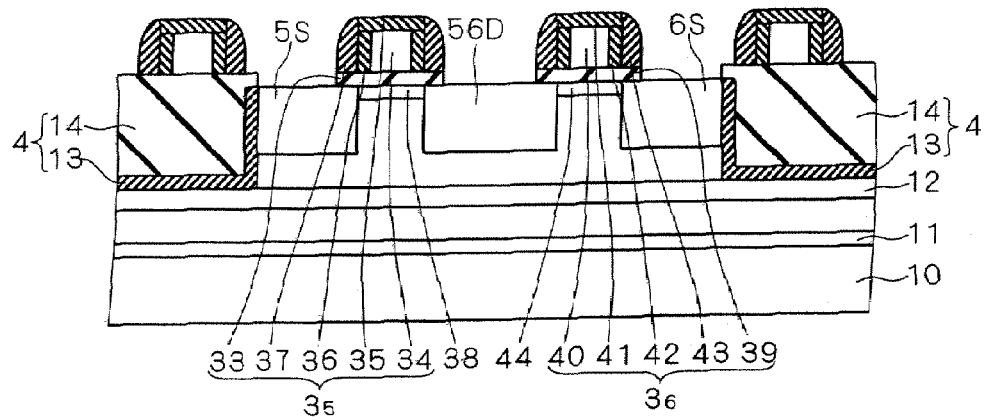
FIGS. 15 through 19 are cross-sectional views showing, in order of manufacturing steps, a method of manufacturing the semiconductor device according to the second preferred embodiment of the present invention.

FIGS. 15 through 19 are cross-sectional views showing, in order of manufacturing steps, a method of manufacturing the semiconductor device according to the second preferred embodiment. First, memory cell transistors shown in FIG. 15 are formed through similar manufacturing steps to those in the foregoing first preferred embodiment.

Figure 14:
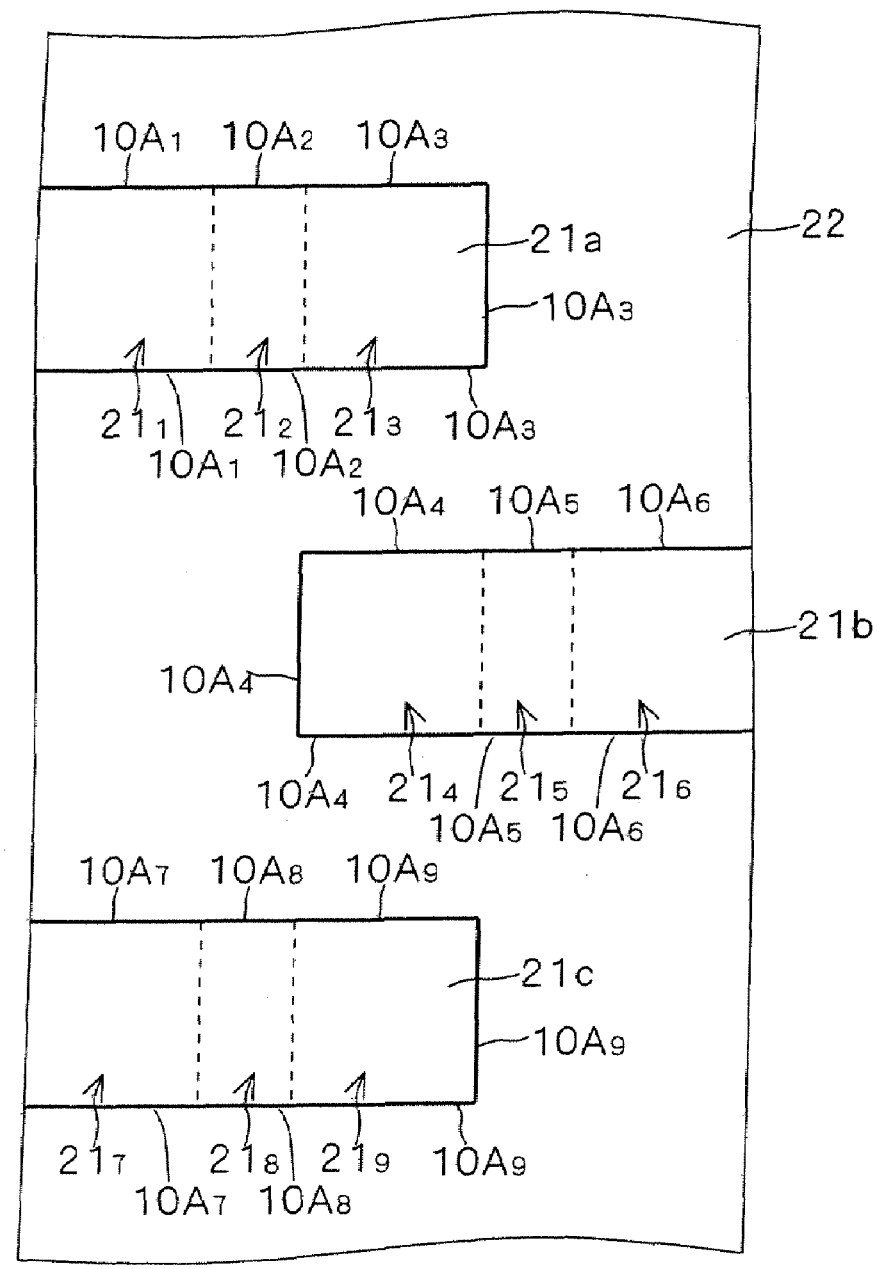
FIG. 14 is a top plan view showing a formation pattern of a silicon nitride film, corresponding to a portion of FIG. 12.

FIG. 14 is a top plan view showing a formation pattern of a silicon nitride film 21 when forming the element isolating insulation film 4, corresponding to a portion of FIG. 12. The silicon nitride film 21 corresponding to the element forming region $AR_{11}$ (denoted by reference character 21a in FIG. 14) has a first portion $21_1$, a second portion $21_2$, and a third portion $21_3$, which are connected in that order along the X direction. Likewise, the silicon nitride film 21 that corresponds to the element forming region $AR_{21}$ (denoted by reference character 21b in FIG. 14) has a fourth portion $21_4$, a fifth portion $21_5$, and a sixth portion $21_6$, which are connected in that order along the X direction. Likewise, the silicon nitride film 21 that corresponds to the element forming region $AR_{31}$ (denoted by reference character 21c in FIG. 14) has a seventh portion $21_7$, an eighth portion $21_8$, and a ninth portion $21_9$, which are connected in that order along the X direction.

The third portion $21_3$, the fourth portion $21_4$, and the ninth portion $21_9$ correspond to the source regions 5S and 6S. The second portion $21_2$, the fifth portion $21_5$, and the eighth portion $21_8$ correspond to the doped channel regions 38 and 44. The first portion $21_1$, the sixth portion $21_6$, and the seventh portion $21_7$ correspond to the drain region 56D.

The third portion $21_3$, the fourth portion $21_4$, and the ninth portion $21_9$ are spaced apart from each other and aligned in that order along the Y direction. The second portion $21_2$ and the eighth portion $21_8$ are spaced apart from each other and are aligned along the Y direction. The first portion $21_1$ and the seventh portion $21_7$ are spaced apart from each other and are aligned along the Y direction. The second portion $21_2$ and the fifth portion $21_5$ are not aligned along the Y direction, and the first portion $21_1$ and the sixth portion $21_6$ are not aligned along the Y direction either. The recessed portion 22 has first to ninth side surfaces $10A_1$ to $10A_9$ that are defined by the silicon substrate 10 below the first to ninth portions $21_1$ to $21_9$, respectively.

In a similar manner to the manufacturing step shown in FIG. 5, the doped channel regions 5 are formed by implanting p-type impurity ions $23_1$, $23_2$ in the Y direction from diagonally above while an implant angle α of the ion implantation is controlled within a range $\tan^{-1}(W2/T) < \alpha \leq \tan^{-1}(W1/T)$, with the silicon oxide film 20 and the silicon nitride film 21 having been formed. As a result, the doped channel regions 5 are formed, of the second side surface $10A_2$ and the third side surface $10A_3$, only in the second side surface $10A_2$, of the fourth side surface $10A_4$ and the fifth side surface $10A_5$, only in the fifth side surface $10A_5$, and of the eighth side surface $10A_8$ and the ninth side surface $10A_9$, only in the eighth side surface $10A_8$.

Referring to FIG. 15, after a transistor structure similar to that of FIG. 2 is obtained, a silicon nitride film is entirely formed by a CVD technique. Next, the silicon nitride film is etched back by an anisotropic dry etching technique, thereby forming sidewalls 37 and 43. This provides gate structures $3_5$ and $3_6$ having silicon oxide films 33 and 39, conductive films 34 and 40, silicon nitride films $3_5$ and 41, insulating films $3_6$ and 42, and the sidewalls 37 and 43, respectively.

Figure 16:
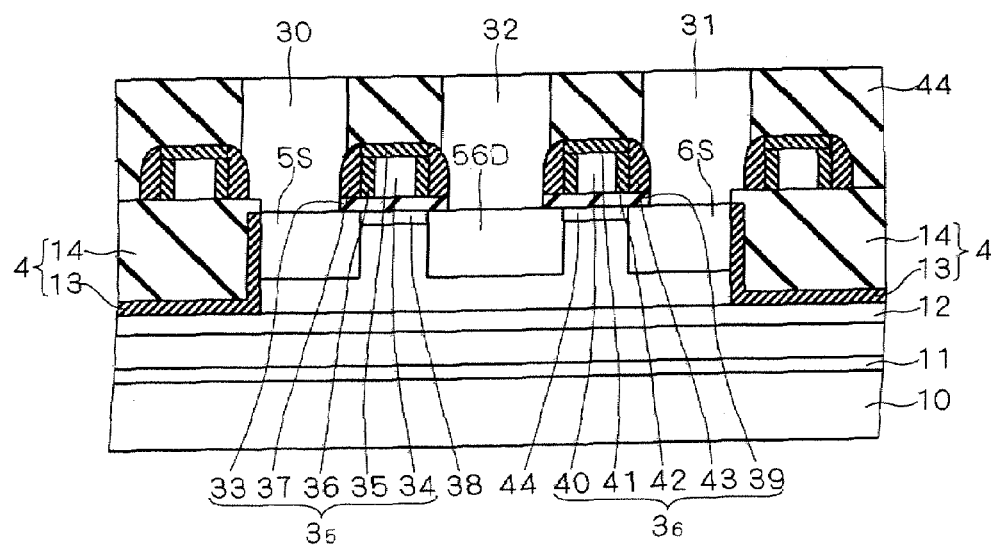

Next, referring to FIG. 16, a silicon oxide film 44 doped with an impurity such as B or P is entirely formed by a coating technique or a CVD technique so as to cover the gate structures $3_5$ and $3_6$. Subsequently, annealing is performed in an $O_2$, $N_2$, or $H_2$ atmosphere. Then, contact holes respectively connected to the source regions 5S, 6S and the drain region 56D are formed in the silicon oxide film 44 by a photolithography technique and an anisotropic dry etching technique. Thereafter, contact plugs 30 to 32 respectively connected to the source regions 5S, 6S and the drain region 56D are formed by filling up the contact holes with a polysilicon film doped with an impurity such as P, As, or Sb.

Figure 17:
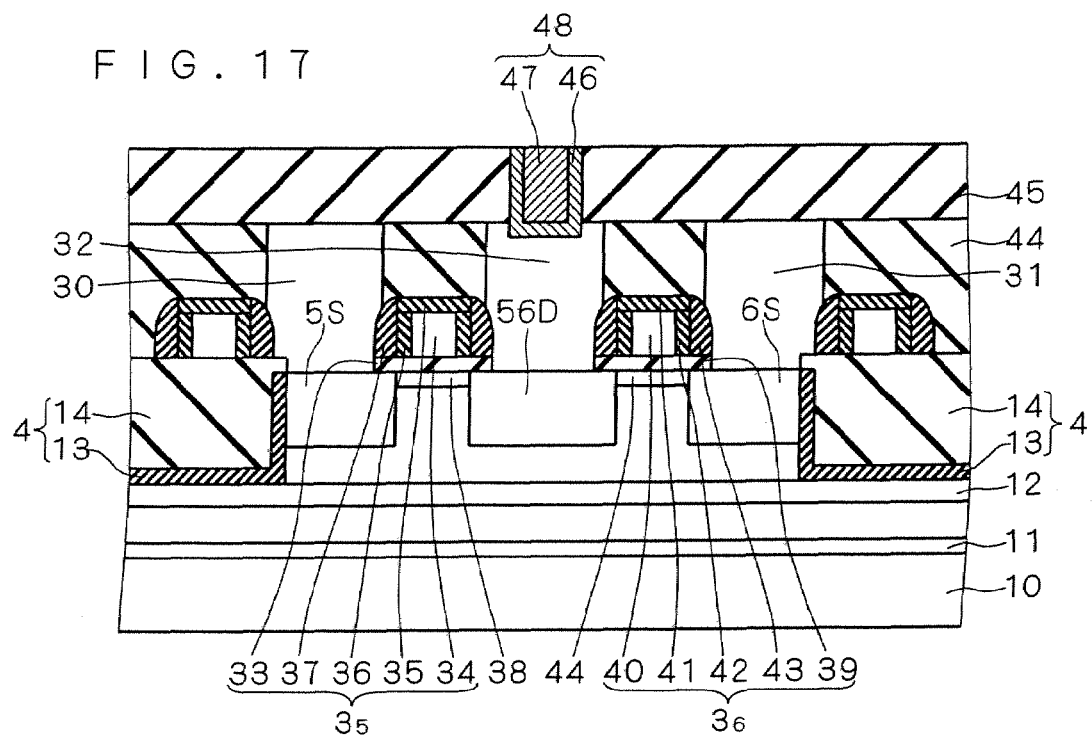

Next, referring to FIG. 17, a silicon oxide film 45 is entirely formed by a CVD technique. Then, a contact hole connected to the contact plug 32 is formed in the silicon oxide film 45 by a photolithography technique and an anisotropic dry etching technique. Thereafter, a bit line 48 connected to the contact plug 32 is formed by filling up the contact hole with a barrier metal film 46 of TiN, TaN, WN, $TiSi_2$, $COSi_2$ or the like, and a metal film 47 of W, Ti, Cu, Al, or the like.

Figure 18:
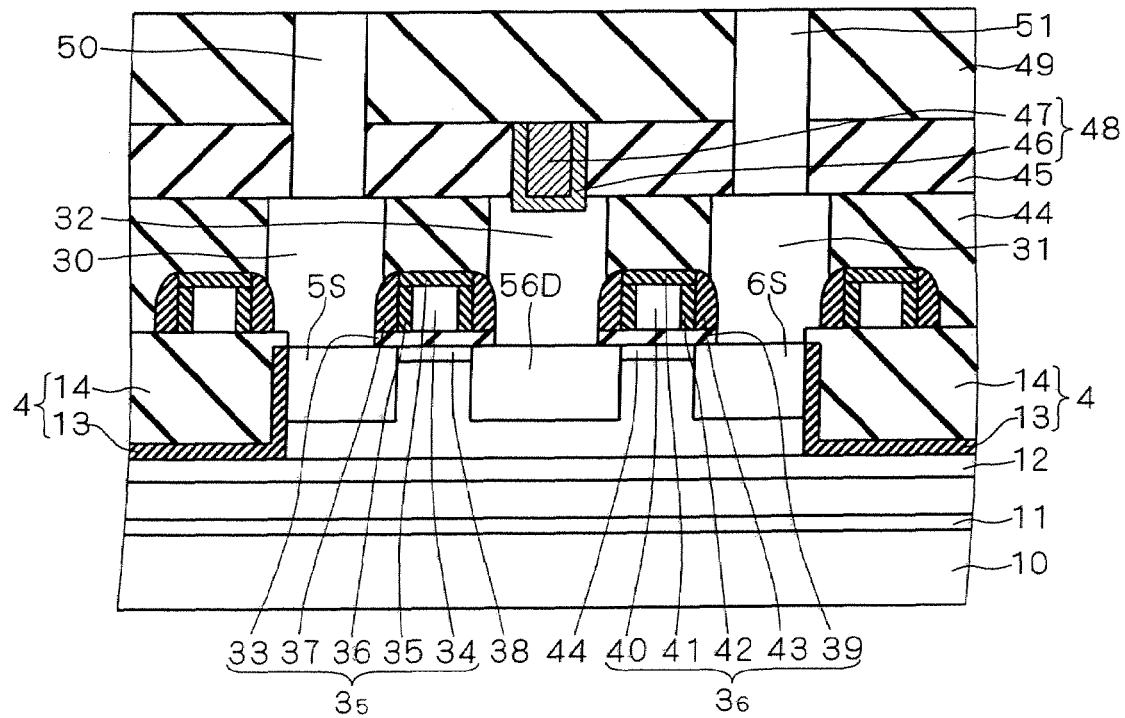

Subsequently, referring to FIG. 18, a silicon oxide film 49 is entirely formed by a CVD technique. Then, contact holes respectively connected to the contact plugs 30 and 31 are formed in the silicon oxide films 45 and 49 by a photolithography technique and an anisotropic dry etching technique. Next, contact plugs 50 and 51 respectively connected to the contact plugs 30 and 31 are formed by filling the contact holes with a polysilicon film doped with an impurity such as P, As, or Sb. Depending upon the material of which a later-formed capacitor lower electrode is formed, the material of the contact plugs 50 and 51 may be Ti, W, TiN, WN, TaN, or the like.

Figure 19:
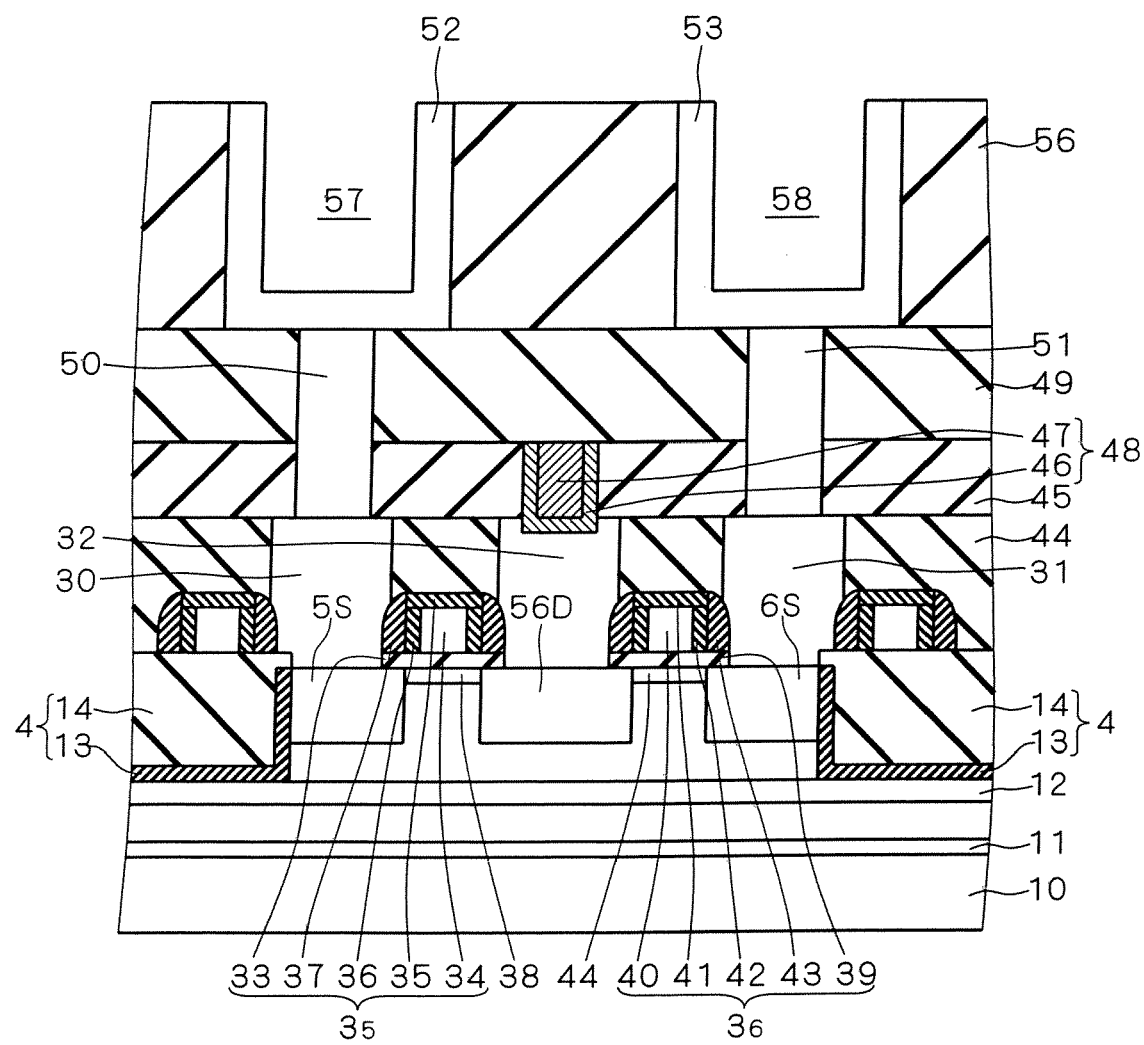

Then, referring to FIG. 19, a silicon oxide film 56 is entirely formed by a CVD technique. Thereafter, recesses respectively connected to contact plugs 50 and 51 are formed in the silicon oxide film 56 by a photolithography technique and an anisotropic dry etching technique. Subsequently, a polysilicon film doped with an impurity such as P, As, or Sb is entirely formed by a CVD technique. Then, the polysilicon film is polished by a CMP technique until an upper surface of the silicon oxide film 56 is exposed. This forms polysilicon films 52 and 53 respectively connected to the contact plugs 50 and 51. The polysilicon films 52 and 53 function as capacitor lower electrodes. It should be noted, however, that a metal film of Ti, W, TiN, WN, Pt, Ru, or the like may be formed in place of the polysilicon films 52 and 53.

Next, the silicon oxide film 56 is removed by an etching technique using HF. It should be noted, however, that a lower portion of the silicon oxide film 56 may be left unremoved in order to prevent the polysilicon films 52 and 53 from collapsing due to mechanical stress during the process. Subsequently, an insulating film 54 of $SiO_2$, $Si_3N_4$, $Ta_2O_5$, $Al_2O_3$, HfO, or the like is entirely formed. The insulating film 54 functions as a capacitor dielectric film. Then, a conductive film 55 of polysilicon, Ti, W, TiN, WN, Pt, Ru, or like is entirely formed. The conductive film 55 functions as a capacitor upper electrode. With the manufacturing steps described above, a structure shown in FIG. 13 is obtained.

Thus, with the method of manufacturing the semiconductor device according to the second preferred embodiment, it is possible to suppress reduction in the threshold voltage of memory cell transistors and the occurrence of the inverse narrow width effect, for the same reasons as those in the foregoing first preferred embodiment.

Moreover, because the doped channel regions 5 are not formed in the source regions 5S and 6S, the n-type source regions 5S and 6S do not suffer from reduction in the impurity concentration arising from the formation of the p-type doped channel regions 5. Therefore, the contact resistance between the respective source regions 5S, 6S and the contact plugs 30, 31 do not increase, and consequently, degradation in data write characteristics can be avoided. Furthermore, degradation in refresh characteristics can be avoided because the electric field strength of the source regions 5S and 6S does not become high.

Third Preferred Embodiment

Figure 20A:
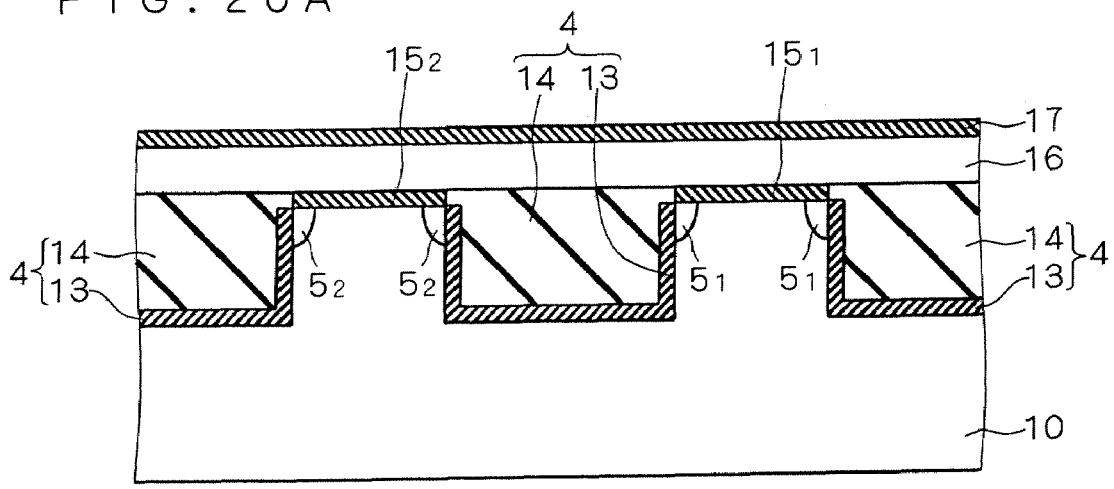
FIGS. 20 and 21 are cross-sectional views showing, in order of manufacturing steps, a method of manufacturing a semiconductor device according to a third preferred embodiment of the present invention.
Figure 20B:
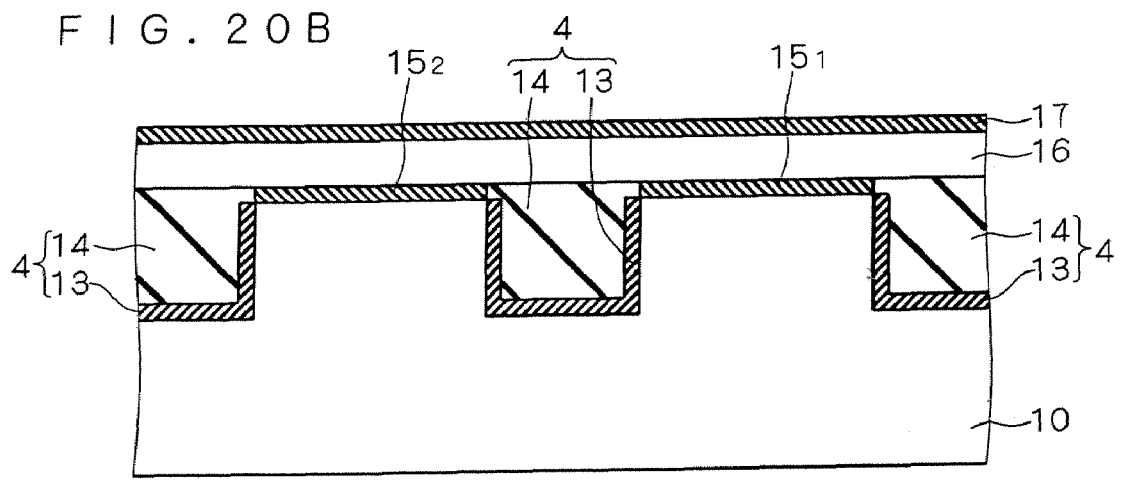
Figure 20C:
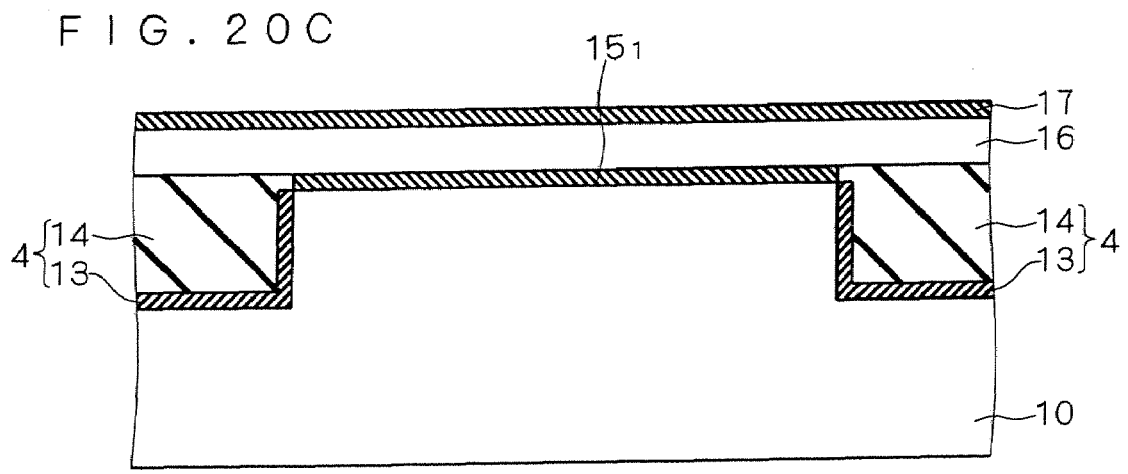
Figure 21A:
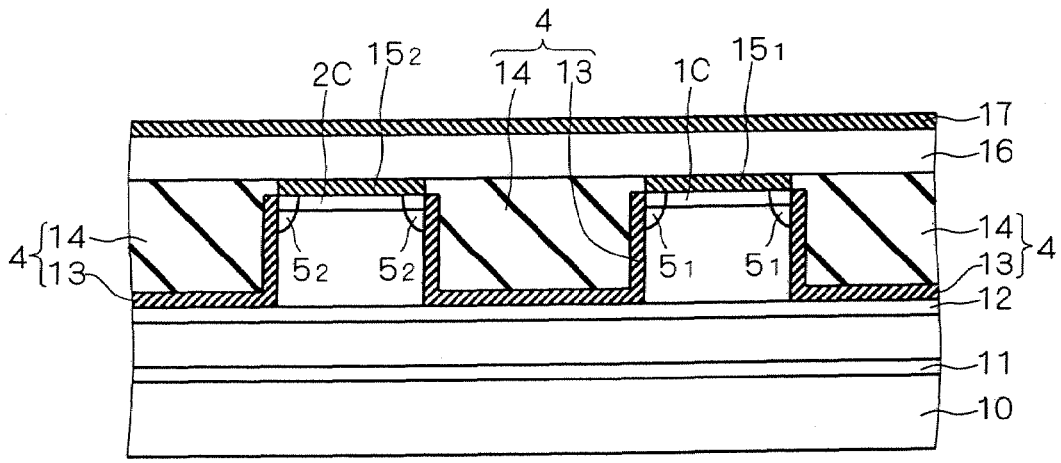
Figure 21B:
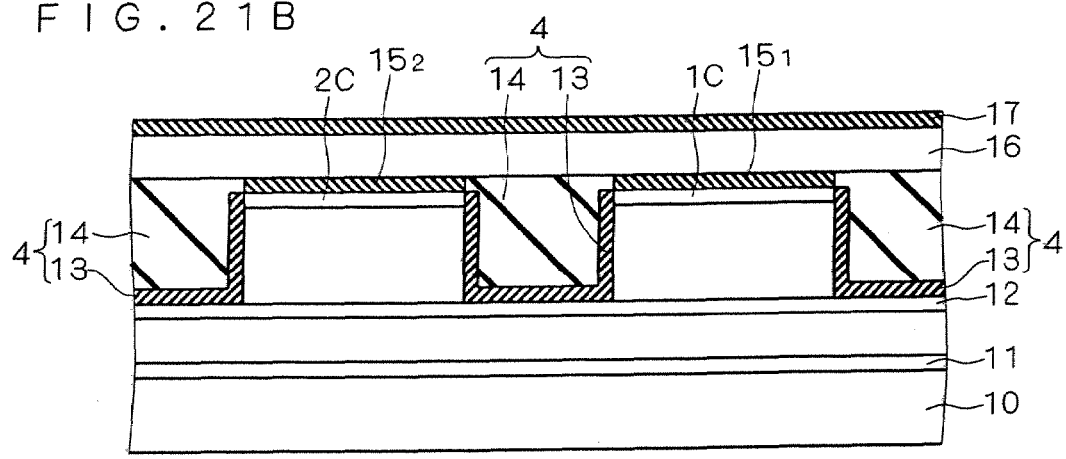
Figure 21C:
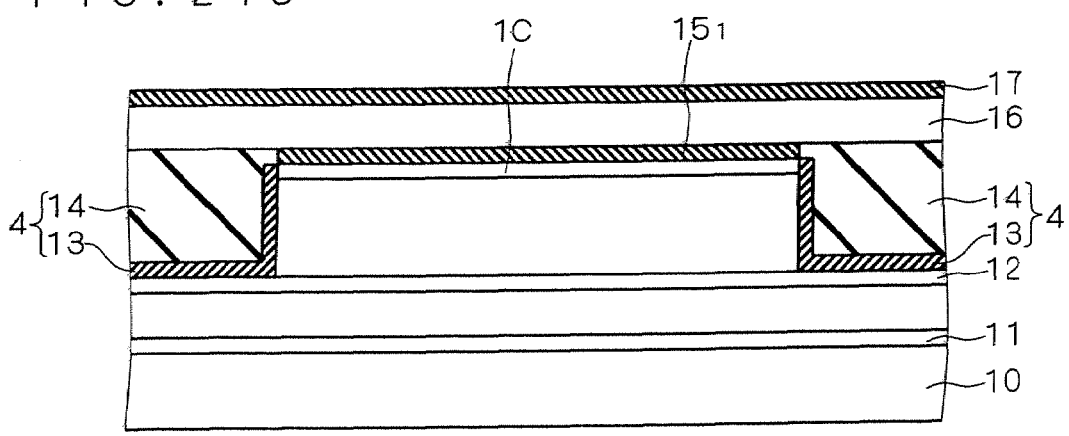

FIGS. 20 and 21 are cross-sectional views showing, in order of manufacturing steps, a method of manufacturing a semiconductor device according to a third preferred embodiment of the present invention. First, a structure shown in FIG. 8 is obtained through the manufacturing steps similar to those in the foregoing first preferred embodiment. Next, the silicon oxide film 20 is removed using an aqueous solution of HF or the like. Then, referring to FIG. 20, the silicon oxide films $15_1$ and $15_2$ functioning as the gate insulating film are formed on the upper surface of the silicon substrate 10 that is in the element forming regions AR1 and AR2. Subsequently, the conductive film 16 is formed on the silicon oxide films $15_1$ and $15_2$ as well as on the element isolating insulation film 4 by a CVD technique or the like. Thereafter, the silicon nitride film 17 is formed on the conductive film 16 by a CVD technique or the like.

Next, referring to FIG. 21, an impurity such as B is ion-implanted into silicon substrate 10 through the silicon nitride film 17, the conductive film 16, and the silicon oxide film $15_1$ and $15_2$. This forms a p-type well region 11. Then, an impurity such as B, $BF_2$, or In is ion-implanted into the silicon substrate 10 through the silicon nitride film 17, the conductive film 16, and the silicon oxide films $15_1$ and $15_2$. This forms the p-type channel cut region 12. Subsequently, an impurity such as B, $BF_2$, or In is ion-implanted into the silicon substrate 10 through the silicon nitride film 17, the conductive film 16, and the silicon oxide films $15_1$ and $15_2$. This forms the p-type doped channel regions 1C and 2C. Thereafter, the above-mentioned impurities that have been ion-implanted in the silicon substrate 10 are activated by carrying out a heat treatment.

Next, the silicon nitride film 17 is patterned by a photolithography technique and an anisotropic dry etching technique. Subsequently, using the silicon nitride film 17 as an etch mask, the conductive film 16 is etched by an anisotropic dry etching technique. Then, an insulating film 18 is formed by oxidizing the conductive film 16 with a lamp oxidation technique or the like. Thereafter, the n-type source regions 1S and 2S as well as the n-type drain regions 1D and 2D are formed in the upper surface of the silicon substrate 10 by ion-implanting an impurity such as P, As, or Sb using the silicon nitride film 17 as an implant mask. With the manufacturing steps described above, a structure shown in FIG. 2 is obtained.

As described above, in the method of manufacturing the semiconductor device according to the third preferred embodiment, the silicon oxide films $15_1$ and $15_2$, which function as the gate insulating films, are formed in the manufacturing step shown in FIG. 20. Thereafter, the doped channel regions 1C and 2C are formed in the manufacturing step shown in FIG. 21. Consequently, the impurity contained in the doped channel regions 1C and 2C is not absorbed in the gate insulating films by the heat treatment for forming the gate insulating films. As a result, it is possible to avoid the reduction in threshold voltage and the occurrence of the inverse narrow width effect that are caused by reduction in the impurity concentration in the doped channel regions 1C and 2C.

Accordingly, when forming the doped channel regions 1C and 2C, it is unnecessary to ion-implant a p-type impurity at a higher concentration than a desired value; therefore, it is possible to avoid degradations in data write characteristics and refresh characteristics.

It should be noted that in the third preferred embodiment, the above-described advantageous effects may be obtained even without forming the doped channel regions $5_1$ and $5_2$, but it is more effective if the doped channel regions $5_1$ and $5_2$ are formed.

Fourth Preferred Embodiment

Figure 22:
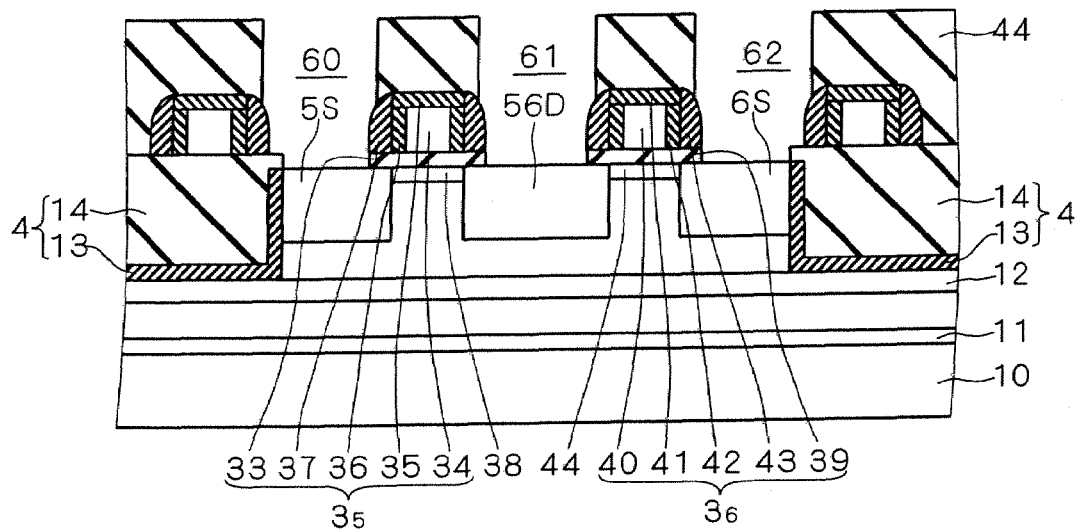
FIGS. 22 and 23 are cross-sectional views showing, in order of manufacturing steps, a method of manufacturing a semiconductor device according to a fourth preferred embodiment of the present invention.
Figure 23:
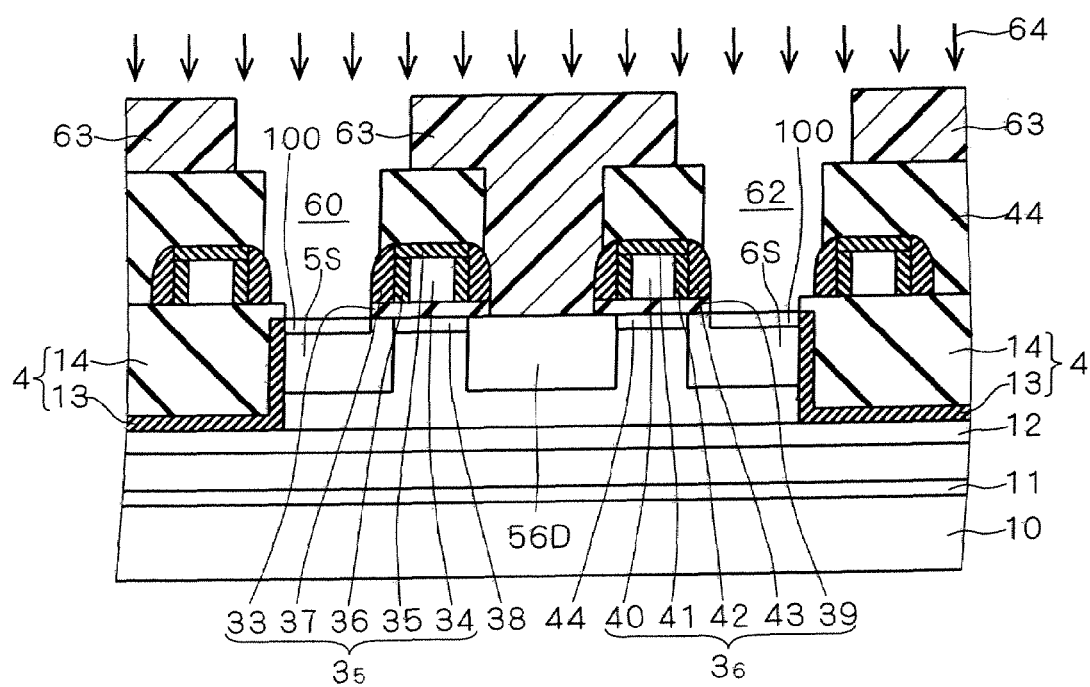

FIGS. 22 and 23 are cross-sectional views showing, in order of manufacturing steps, a method of manufacturing a semiconductor device according to a fourth preferred embodiment of the present invention. First, a structure shown in FIG. 15 is obtained through the manufacturing steps similar to those in the foregoing second preferred embodiment. Next, referring to FIG. 22, a silicon oxide film 44 is entirely formed by a CVD technique or the like so as to cover the gate structures $3_5$ and $3_6$. Subsequently, contact holes 60, 62, and 61 respectively connected to the source regions 5S and 6S and the drain region 56D are formed in the silicon oxide film 44 by a photolithography technique and an anisotropic dry etching technique.

Next, referring to FIG. 23, a photoresist 63 having such a pattern that portions thereof that are above the contact holes 60 and 62 are opened is formed by a photolithography technique. Then, using the photoresist 63 as an implant mask, an impurity such as P, As, or Sb is ion-implanted at a concentration of about 1 E12/cm$^2$ to 1 E14/cm$^2$. This forms n-type impurity-introduced regions 100 in the respective upper surfaces of the source regions 5S and 6S. Next, the photoresist 63 is removed. Then, contact plugs 30 to 32 are formed by filling the contact holes 60 to 62 with a polysilicon film doped with an impurity such as P, As, or Sb. From this point on, the processes that follow the step shown in FIG. 17 are performed, thus completing a semiconductor device.

As described above, with the method of manufacturing the semiconductor device according to the fourth preferred embodiment, the electric field strength of the source regions 5S and 6S can be further lowered in comparison with the second preferred embodiment by forming the impurity-introduced regions 100 in the upper surfaces of the source regions 5S and 6S. As a consequence, device characteristics such as refresh characteristics and hot carrier characteristics can be further improved, which accordingly enhances device reliability. Moreover, since the impurity-introduced regions 100 are formed only in the source regions 5S and 6S, degradation in short channel characteristics of the memory cell transistors can be avoided.

Fifth Preferred Embodiment

Figure 24:
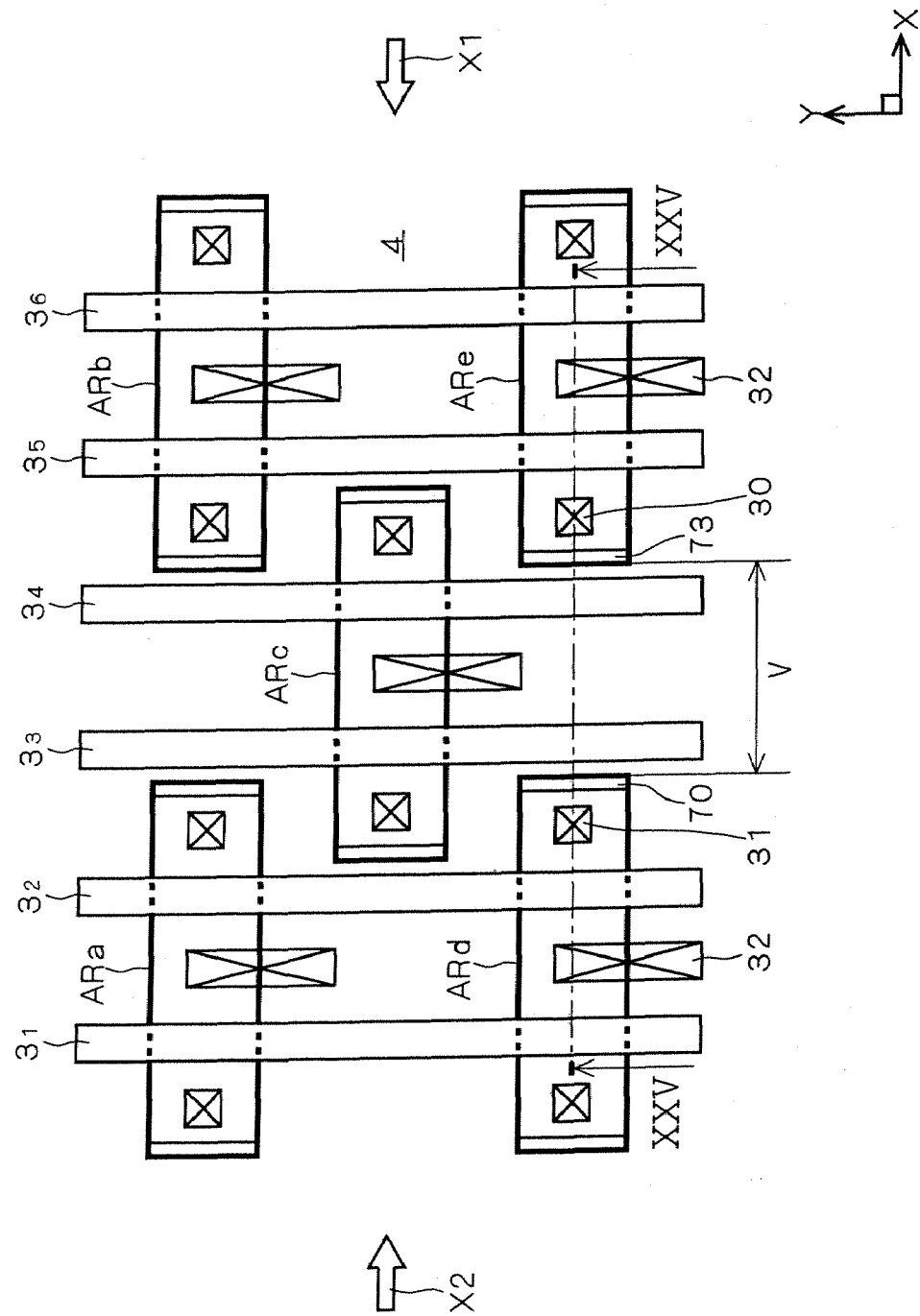
FIG. 24 is a top plan view showing a structure of a semiconductor device according to a fifth preferred embodiment of the present invention.
Figure 25:
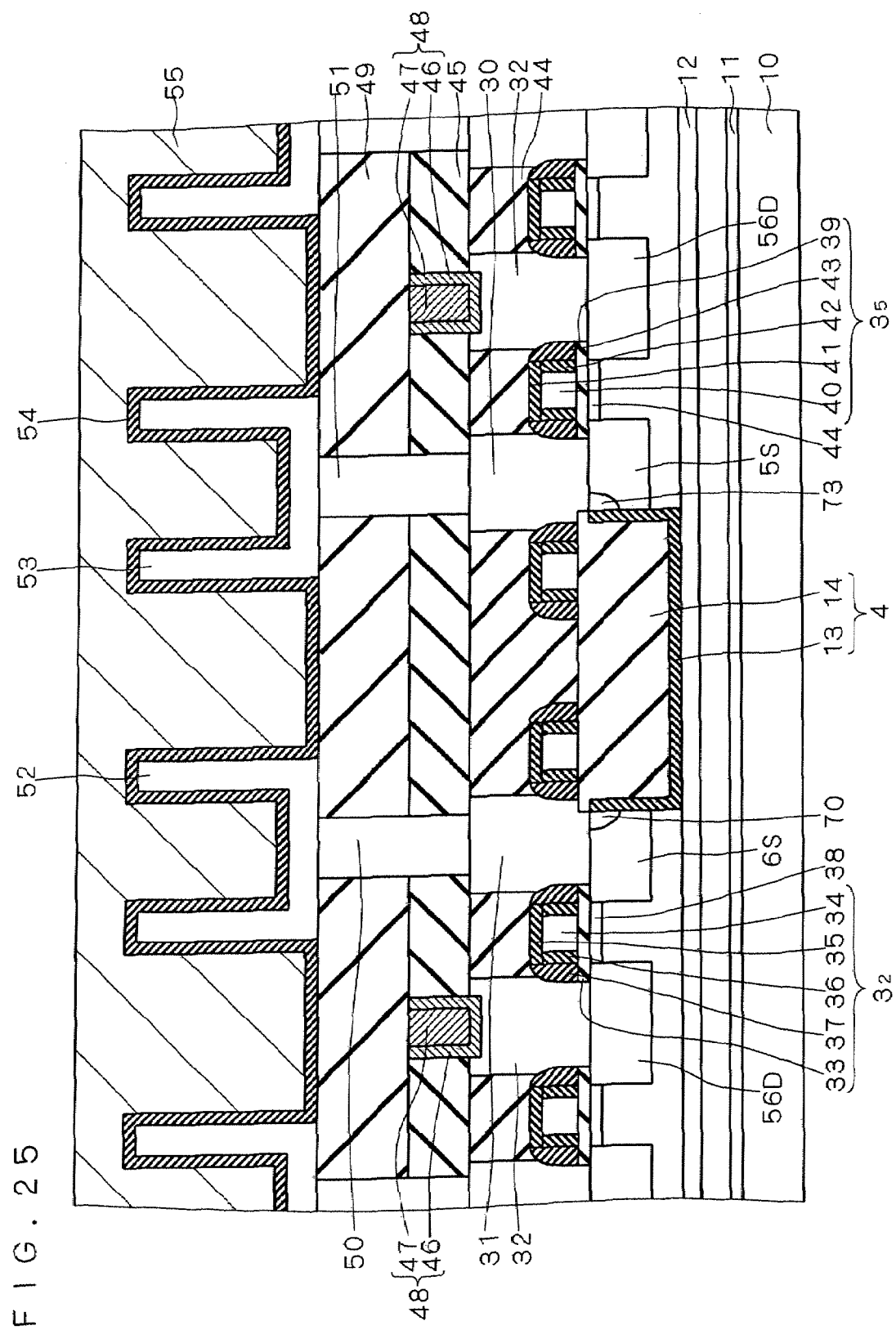
FIG. 25 is a cross-sectional view showing a cross-sectional structure concerning a position along the line XXV-XXV shown in FIG. 24.

FIG. 24 is a top plan view showing a structure of a semiconductor device according to a fifth preferred embodiment of the present invention. FIG. 25 is a cross-sectional view showing a cross-sectional structure concerning a position along the line XXV-XXV shown in FIG. 24. Referring to FIG. 24, a plurality of element forming regions AR (denoted by reference characters ARa to ARe in FIG. 24) are defined by the element isolating insulation film 4. The element forming region ARa and the element forming region ARb, which belong to a common row in a memory cell array, and the element forming region ARd and the element forming region ARe, which belong to a common row, are each mutually spaced apart and aligned along the X direction. Referring to FIGS. 24 and 25, in each of the element forming regions AR, impurity-introduced regions 70 and 73 are formed in ends of the source regions 5S and 6S with respect to the X direction. It should be noted that the doped channel regions 5 may be formed in each of the element forming regions AR, as in the foregoing second preferred embodiment.

Figure 26:
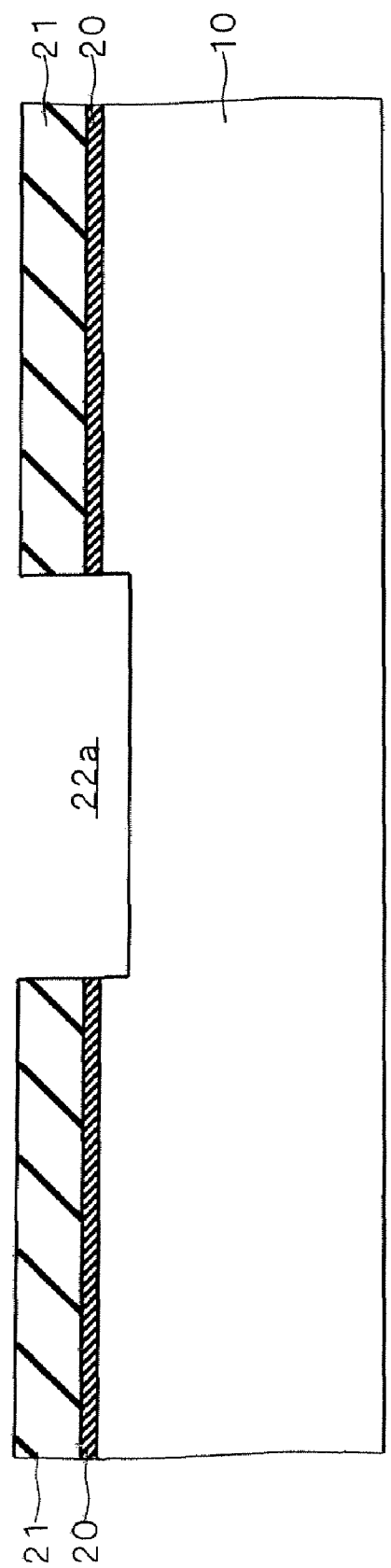
FIGS. 26 and 27 are cross-sectional views showing, in order of manufacturing steps, a method of manufacturing the semiconductor device according to the fifth preferred embodiment of the present invention.
Figure 27:
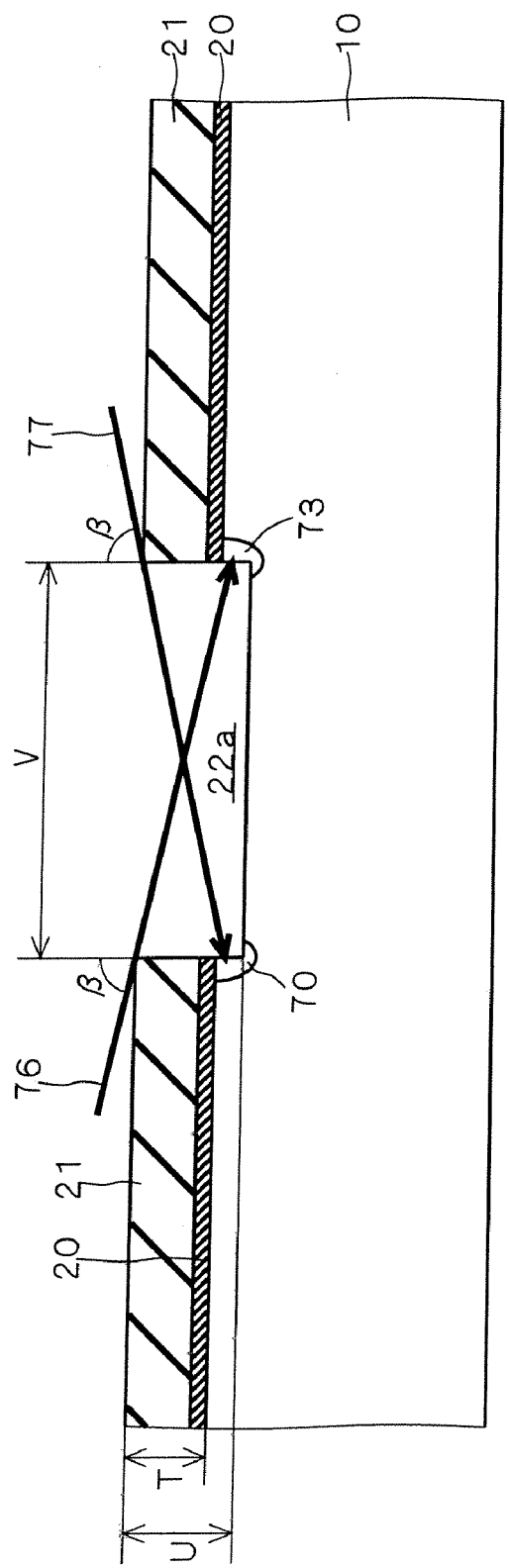

FIGS. 26 and 27 are cross-sectional views showing, in order of manufacturing steps, a method of manufacturing the semiconductor device according to the fifth preferred embodiment of the present invention. First, referring to FIG. 26, the silicon oxide film 20 and the silicon nitride film 21 are formed in a similar manner to the foregoing first preferred embodiment. In addition, a recessed portion 22a is formed in the upper surface of the silicon substrate 10 by overetching in the etching for patterning the silicon oxide film 20 and the silicon nitride film 21.

Next, referring to FIG. 27, with the silicon oxide film 20 and the silicon nitride film 21 having been formed, ions 76 and 77 of an n-type impurity such as P, As, or Sb are implanted at a concentration of about 1 E12/cm$^2$ to 1 E14/cm$^2$, in the X direction from diagonally above. The ion implantation is sequentially carried out in opposing directions +X and −X, as indicated by arrows X1 and X2 in FIG. 24.

As for implant angle .beta. of the ion implantation (that is, an angle formed by an implant direction of the impurity ions 76, 77 and a direction of the normal to the upper surface of the silicon substrate 10), an implant angle is adopted that satisfies the relationship $\tan^{-1}(V/U) \leq \beta \leq \tan^{-1}(V/T)$, where V is the interval between the silicon nitride films 21 adjacent to each other along the X direction, T is the total film thickness of the silicon oxide film 20 and the silicon nitride film 21, U is the depth from the upper surface of the silicon nitride film 21 to the bottom surface of the recessed portion 22a. For one example, the interval V is about 390 nm, and the depth U is about 170 nm.

When the implant angle .beta. is controlled within that range, the impurity ions 76 and 77 are implanted into portions of the side surfaces of the recessed portion 22a that are perpendicular to the X direction. For example, of the side surface of the recessed portion 22a that corresponds to the third side surface $10A_3$ shown in FIG. 14, impurity ions 76 and 77 are implanted into a portion perpendicular to the X direction. As result, as shown in FIG. 27, n-type impurity-introduced regions 70 and 73 are formed within the upper surface of the silicon substrate 10 that is in the element forming regions ARd and ARe, respectively. Meanwhile, because the ion implantation is performed in the X direction from diagonally above, impurity ions 76 and 77 are not implanted in portions of the side surfaces of the recessed portion 22a that are perpendicular to the Y direction.

Thereafter, the recessed portion 22 is formed and the a silicon oxide film 13 is formed on the side surfaces and the bottom surface of the recessed portion 22, followed by performing the processes subsequent to the manufacturing step shown in FIG. 6, as in the second preferred embodiment; thus, a semiconductor device is completed.

As described above, in the method of manufacturing the semiconductor device according to the fifth preferred embodiment, the impurity-introduced regions 70 and 73 are respectively formed within the upper surface of the silicon substrate 10 that is in the element forming regions AR. Therefore, even if crystal defects are caused in the silicon substrate 10 due to damages arising from, for example, the etching for forming the recessed portion 22, the crystal defects can be covered by the impurity-introduced regions 70 and 73. As a result, leakage current resulting from the crystal defects can be suppressed, and refresh characteristics can therefore be improved.

Moreover, the impurity-introduced regions 70 and 73 are formed only in portions of the source regions 5S and 6S that are in the vicinity of their interfaces with the element isolating insulation film 4, and therefore, it is possible to avoid degradation in short channel characteristics of memory cell transistors.

Sixth Preferred Embodiment

FIGS. 28 through 31 are cross-sectional views showing, in order of manufacturing steps, a method of manufacturing a semiconductor device according to a sixth preferred embodiment of the present invention. FIGS. 28 to 31 show a structure of a memory cell array section in the silicon substrate 10, in which a memory cell array is formed, and a structure of a peripheral circuit section therein, in which a peripheral circuit is formed. The following describes an example in which p-channel MOSFETs are formed in the peripheral circuit section.

Figure 28:
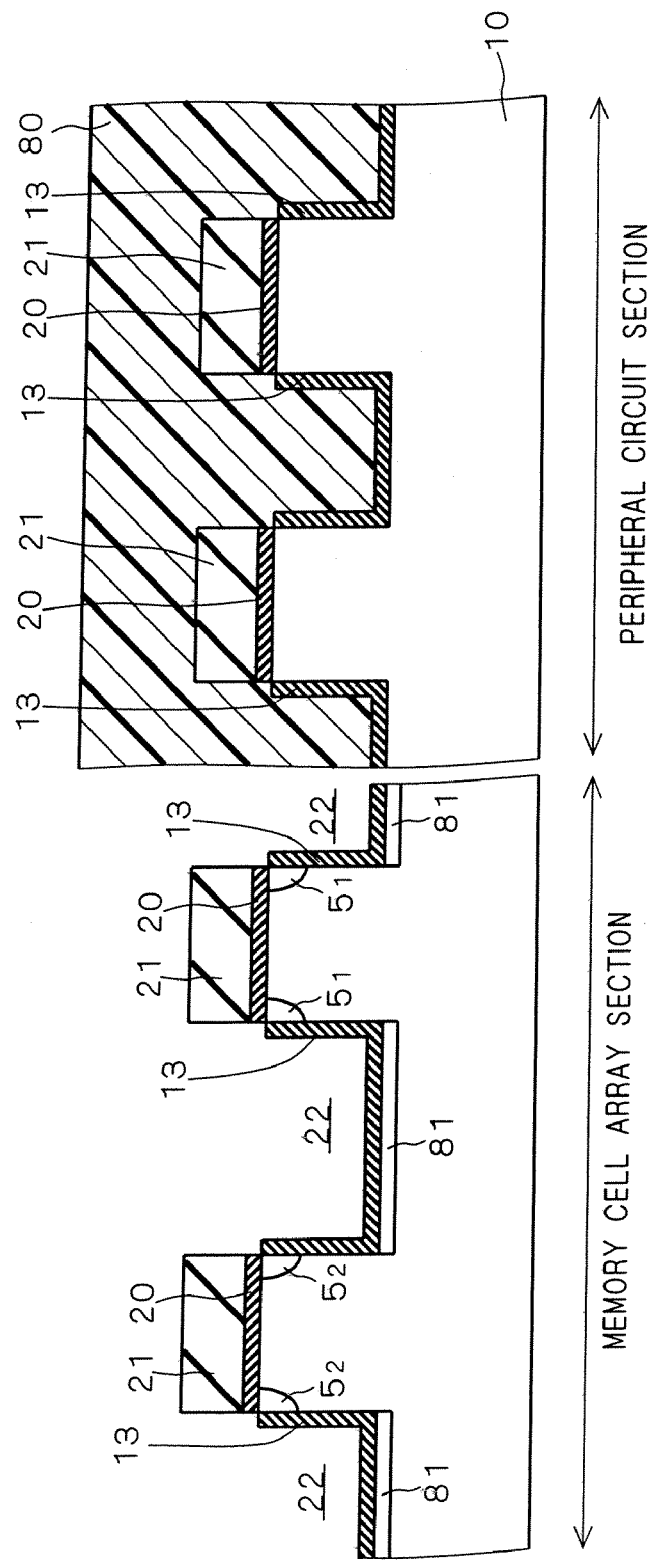
FIGS. 28 through 31 are cross-sectional views showing, in order of manufacturing steps, a method of manufacturing a semiconductor device according to a sixth preferred embodiment of the present invention.

First, referring to FIG. 28, the silicon oxide film 20, the silicon nitride film 21, the recessed portion 22, and the silicon oxide film 13 are formed in the memory cell array section and the peripheral circuit section in a similar manner to the foregoing first preferred embodiment. In addition, the doped channel regions $5_1$ and $5_2$ are formed in the memory cell array section. Next, a photoresist 80 that covers the peripheral circuit section is formed by a photolithography technique. Then, using the photoresist 80 as an implant mask, ions of an impurity such as B or In are implanted into the silicon substrate 10 in a direction perpendicular to the upper surface of the silicon substrate 10 through the recessed portion 22 and the silicon oxide film 13. This forms a p-type channel cut region 81 in the bottom surface of the recessed portion 22 that is in the memory cell array section.

Figure 8A:
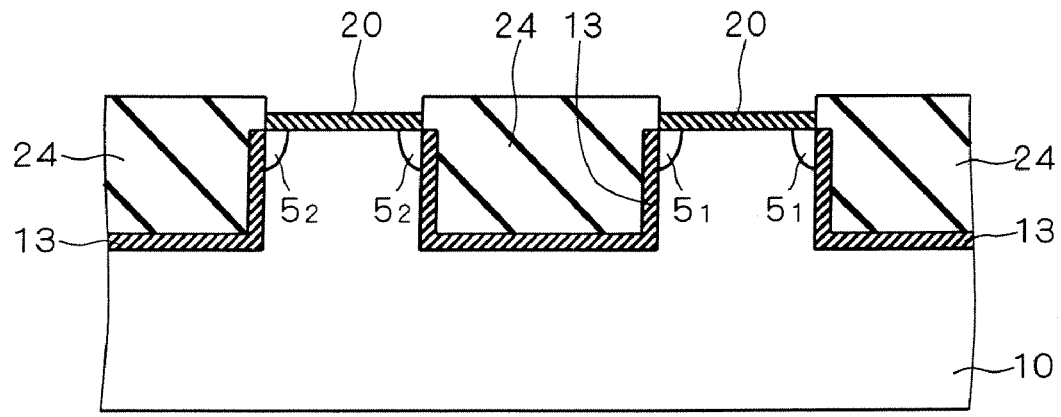
Figure 8B:
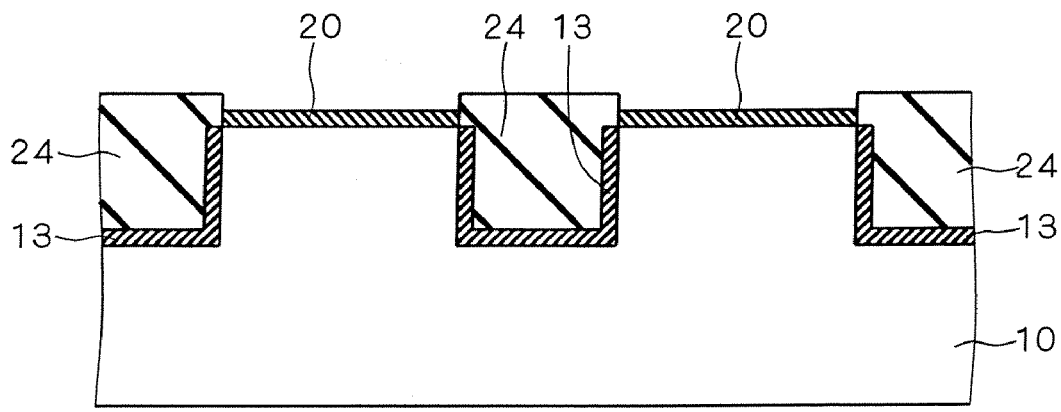
Figure 8C:
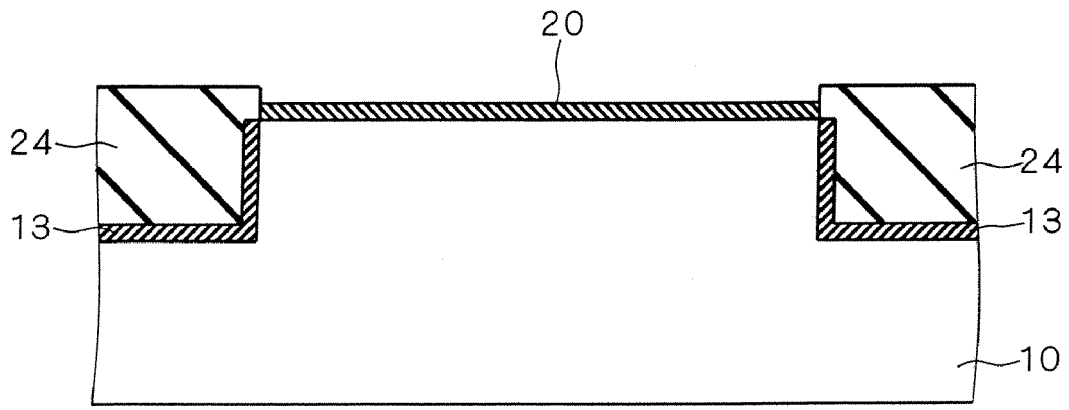
Figure 29:
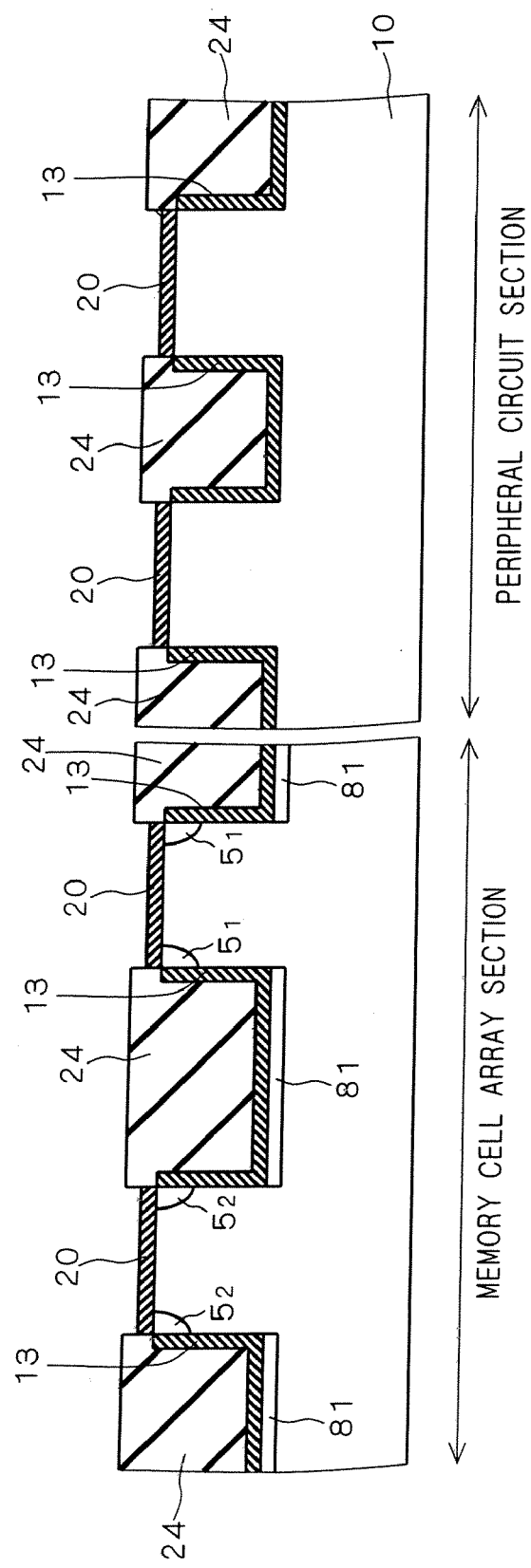

Next, referring to FIG. 29, after removing the photoresist 80, the manufacturing steps shown in FIGS. 6 through 8 are carried out in a similar manner to those in the foregoing first preferred embodiment. Specifically, a silicon oxide film 24 having such a film thickness that it can completely fill up the recessed portion 22 is entirely formed, and subsequently, the silicon oxide film 24 is polished until the upper surface of the silicon nitride film 21 is exposed; thereafter, the silicon oxide film 24 is removed to a desired film thickness, and then, the silicon nitride film 21 is removed.

Figure 30:
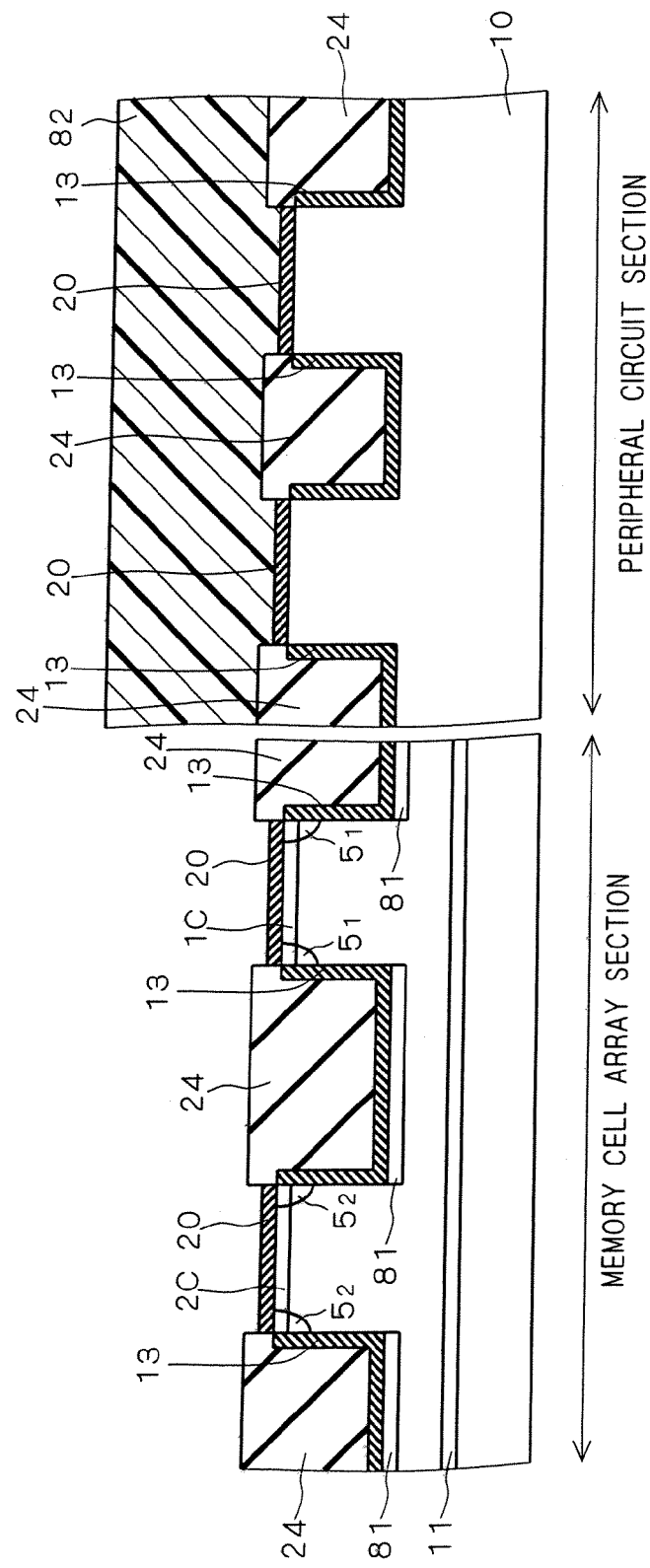

Then, referring to FIG. 30, a photoresist 82 that covers the peripheral circuit section is formed by a photolithography technique. Thereafter, the p-type doped channel regions 1C and 2C as well as the p-type well region 11 are formed within the silicon substrate 10 that is in the memory cell array section by implanting ions of a p-type impurity, using the photoresist 82 as an implant mask.

Figure 31:
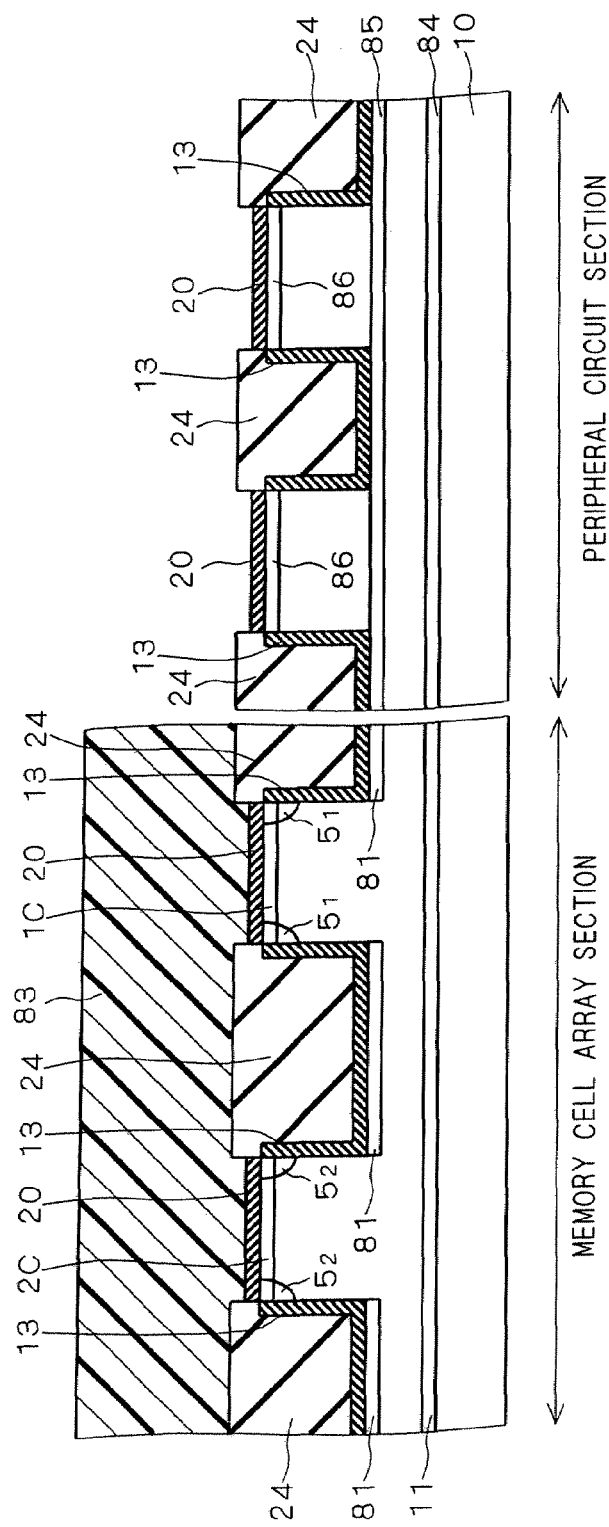
Figure 32:
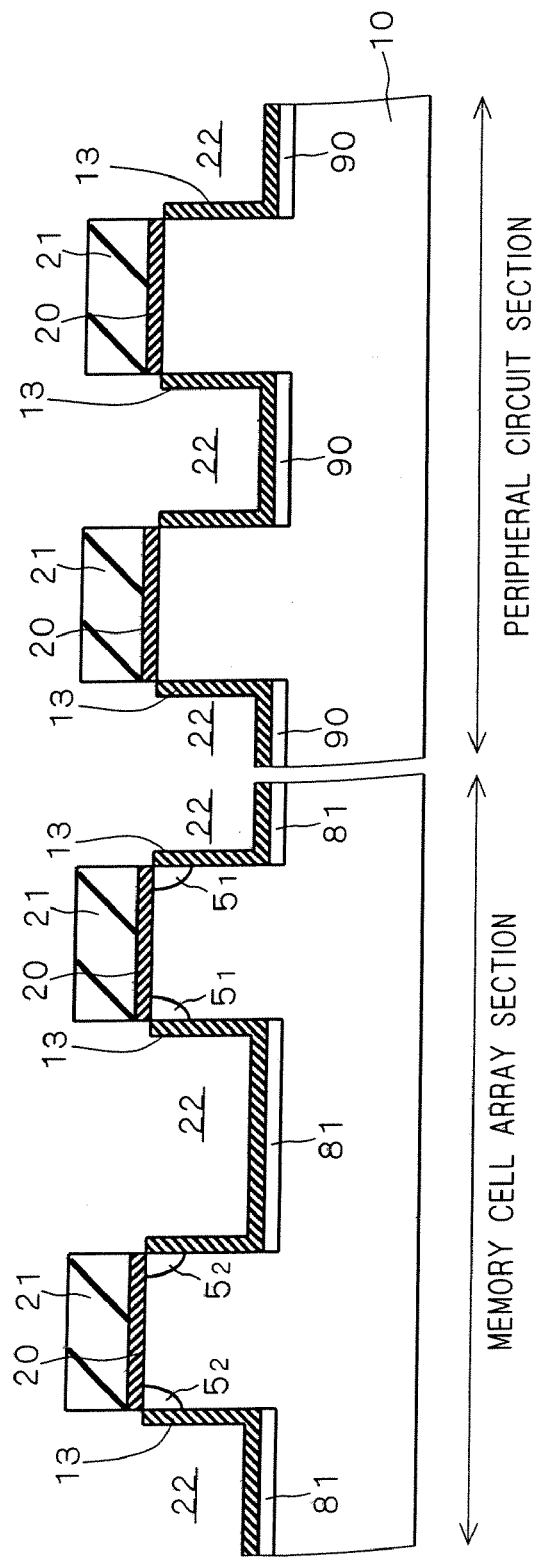
FIGS. 32 through 35 are cross-sectional views showing, in order of manufacturing steps, a method of manufacturing a semiconductor device according to a seventh preferred embodiment of the present invention.

Next, referring to FIG. 31, after removing the photoresist 82, a photoresist 83 that covers the memory cell array section is formed by a photolithography technique. Then, n-type doped channel regions 86, an n-type channel cut region 85, and an n-type well region 84 are formed in the silicon substrate 10 that is in the peripheral circuit section by ion-implanting an n-type impurity using the photoresist 83 as an implant mask.

After removing the photoresist 83, the processes subsequent to the manufacturing step shown in FIG. 10 are performed in a similar manner to the foregoing second preferred embodiment, thus completing a semiconductor device.

As described above, in the method of manufacturing the semiconductor device according to the sixth preferred embodiment, the channel cut regions 81 are formed only within the bottom surface of the recessed portion 22 in the memory cell array section. In other words, the p-type channel cut regions 81 are not formed in portions below the n-type source regions 5S and 6S. For this reason, the electric field strength of the source regions 5S and 6S is further relaxed in comparison with the foregoing second preferred embodiment, and therefore, it becomes possible to improve refresh characteristics.

Further, the peripheral circuit section is covered by the photoresist 80 when performing the ion implantation for forming the channel cut regions 81. Therefore, it is possible to avoid formation of unnecessary channel cut regions 81 within the silicon substrate 10 that is in the peripheral circuit section.

Seventh Preferred Embodiment

FIGS. 32 through 35 are cross-sectional views showing, in order of manufacturing steps, a method of manufacturing a semiconductor device according to a seventh preferred embodiment of the present invention. First, referring to FIG. 32, the silicon oxide film 20, the silicon nitride film 21, the recessed portion 22, and the silicon oxide film 13 are formed in the memory cell array section and the peripheral circuit section, in a similar manner to the foregoing first preferred embodiment. In addition, the doped channel regions $5_1$ and $5_2$ are formed in the memory cell array section. Next, an impurity such as B or In is ion-implanted into the silicon substrate 10 in a direction perpendicular to the upper surface of the silicon substrate 10 through the recessed portion 22 and the silicon oxide film 13. This forms p-type channel cut regions 81 and 90 within the bottom surface of the recessed portion 22 that is in the memory cell array section and in the peripheral circuit section.

Figure 33:
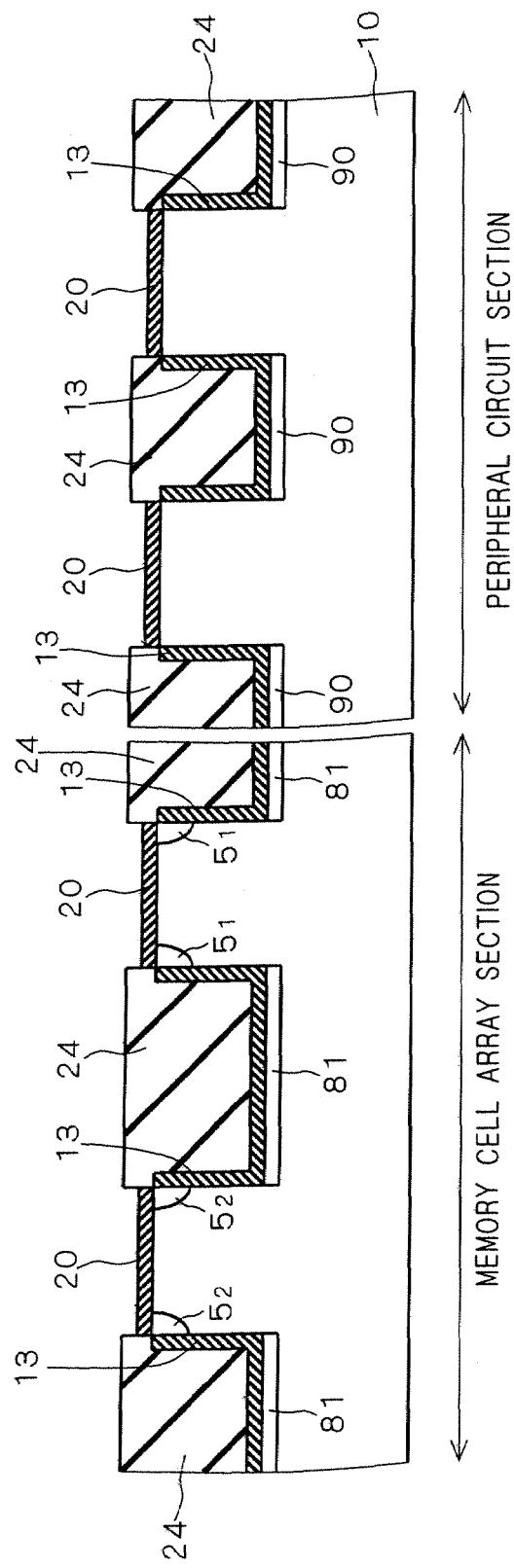

Next, referring to FIG. 33, the manufacturing steps shown in FIGS. 6 through 8 are carried out in a similar manner to that in the foregoing first preferred embodiment. Specifically, a silicon oxide film 24 having such a film thickness that it can completely fill up the recessed portion 22 is entirely formed. Then, the silicon oxide film 24 is polished until the upper surface of the silicon nitride film 21 is exposed; thereafter the silicon oxide film 24 is removed to a desired film thickness, and then, the silicon nitride film 21 is removed.

Figure 34:
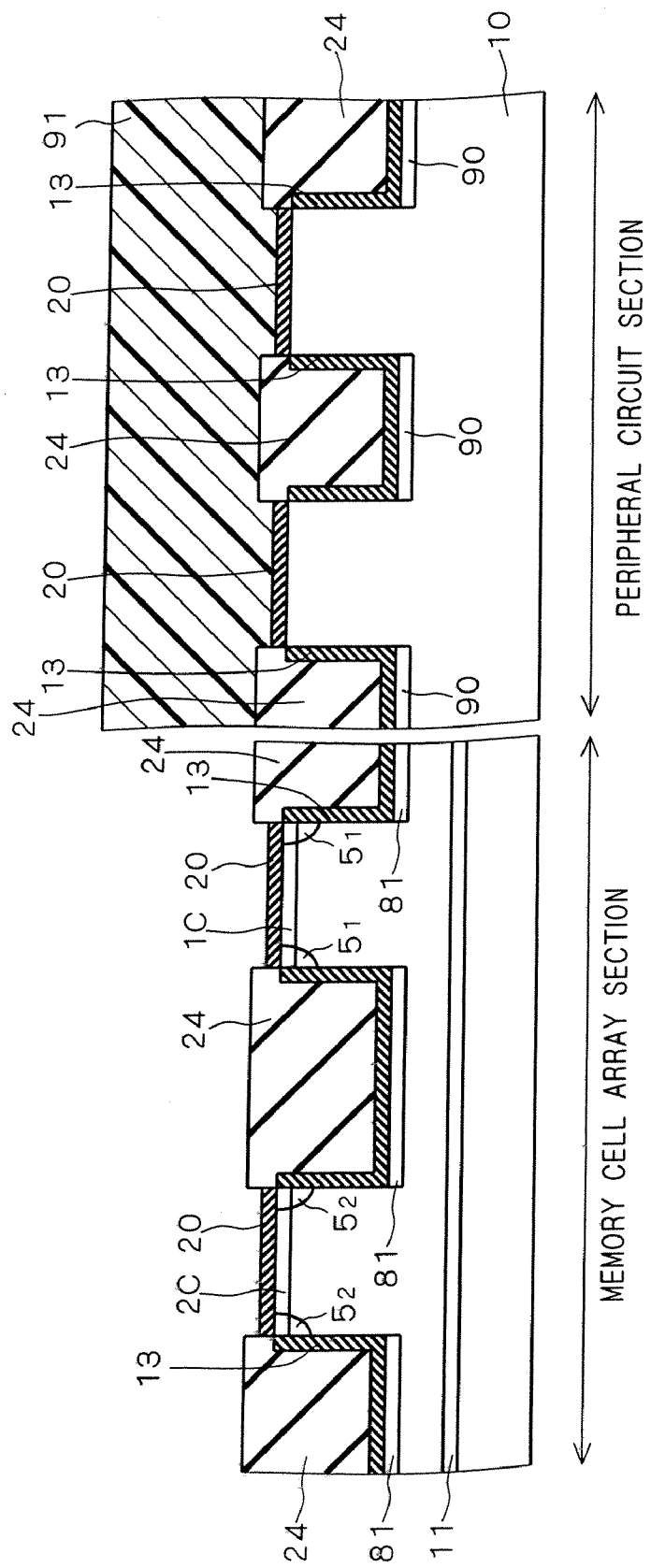

Subsequently, referring to FIG. 34, a photoresist 91 that covers the peripheral circuit section is formed by a photolithography technique. Then, the p-type doped channel regions 1C, 2C, and the p-type well region 11 are formed within the silicon substrate 10 that is in the memory cell array section, by ion-implanting a p-type impurity using the photoresist 91 as an implant mask.

Figure 35:
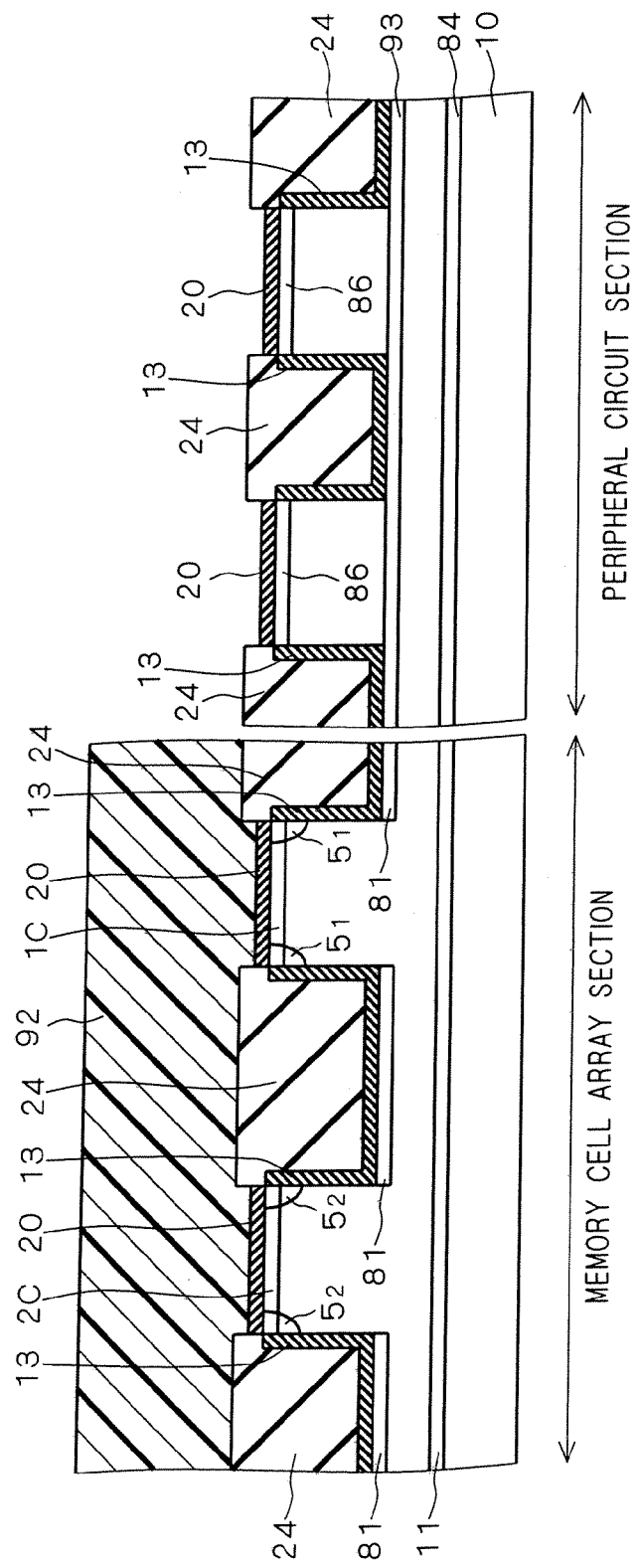

Then, referring to FIG. 35, after removing the photoresist 91, a photoresist 92 that covers the memory cell array section is formed by a photolithography technique. Next, by ion-implanting an n-type impurity using the photoresist 92 as an implant mask, an n-type doped channel region 86, an n-type channel cut region 93, and an n-type well region 84 within the silicon substrate 10 that is in the peripheral circuit section. In the ion implantation for forming the channel cut regions 93, the impurity concentration is set to be about two times the normal concentration. Thereby, the p-type channel cut regions 90 are cancelled out by the n-type channel cut regions 93.

After removing the photoresist 92, the processes subsequent to the manufacturing steps shown in FIG. 10 are performed in a similar manner to those in the foregoing second preferred embodiment, thus completing a semiconductor device.

As described above, with the method of manufacturing a semiconductor according to the seventh preferred embodiment, the electric field strength of the source regions 5S and 6S can be relaxed for the same reasons as in the foregoing sixth preferred embodiment, and therefore, refresh characteristics can be improved.

In addition, the photoresist 80 shown in FIG. 28 is unnecessary, and consequently, the number of required photomasks can be reduced in comparison with the foregoing sixth preferred embodiment.

Eighth Preferred Embodiment

Figure 36:
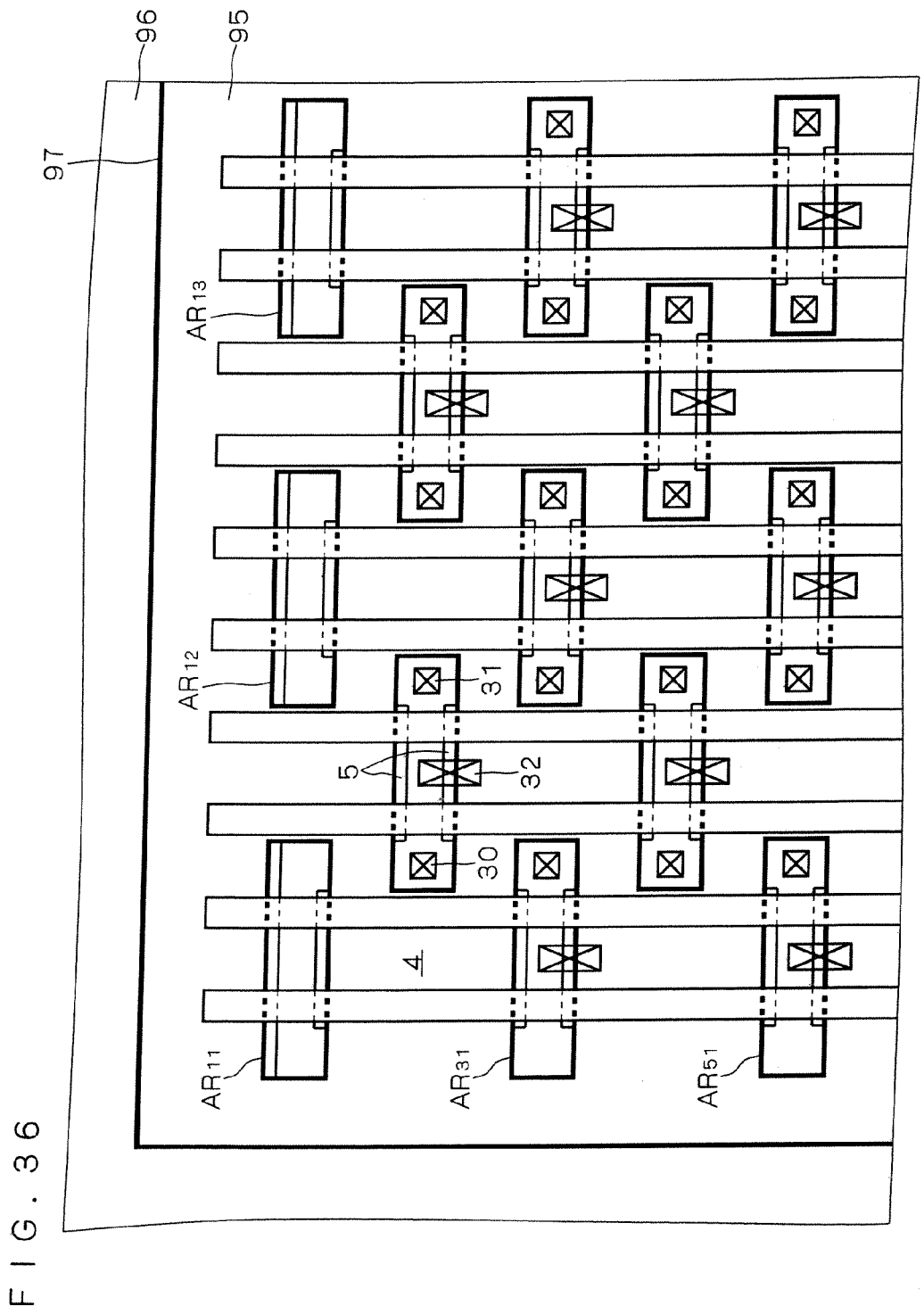
FIG. 36 is a top plan view showing a structure of a semiconductor device according to an eighth preferred embodiment of the present invention.

FIG. 36 is a top plan view showing a structure of a semiconductor device according to an eighth preferred embodiment of the present invention. The silicon substrate 10 has a memory cell array section 95 and a peripheral circuit section 96. In FIG. 36, the boundary between the memory cell array section 95 and the peripheral circuit section 96 is denoted by a hypothetical line 97. In the memory cell array section 95, a plurality of element forming regions AR are defined by the element isolating insulation film 4, and two memory cells are provided in each one of the element forming regions AR. In the eighth preferred embodiment, among a plurality of memory cells that constitute the memory cell array, at least a plurality of memory cells that are arranged in an outermost periphery of the memory cell array are set as dummy cells. Those memory cells that are set as dummy cells do not function as DRAM cells because the contact plugs 30 to 32 are not formed therein.

In the method of manufacturing the semiconductor device according to the second preferred embodiment, locations in which the doped channel regions 5 are to be formed are determined by utilizing the shadowing effect of the silicon nitride film 21 formed on the element forming regions AR adjacent to each other along the Y direction. For this reason, the shadowing effect of the silicon nitride film 21 cannot be utilized for the element forming regions $AR_{11}$, $AR_{12}$, and $AR_{13}$ that are located on ends along the Y direction in the memory cell array section 95, and consequently, the doped channel regions 5 cannot be formed at desired locations. Therefore, it is essential that the memory cells formed in the element forming regions $AR_{11}$, $AR_{12}$, and $AR_{13}$ be set as dummy cells.

Likewise, in the method of manufacturing the semiconductor device according to the foregoing fifth preferred embodiment, the impurity-introduced regions 70 and 73 are formed by the ion implantation in the X direction from diagonally above. For this reason, it may be possible that, due to the structure of the peripheral circuit section 96 or the like, the impurity-introduced regions 70 and 73 are not formed for the element forming regions $AR_{11}$, $AR_{31}$, and $AR_{51}$ that locate on ends with respect to the X direction in the memory cell array section 95. Therefore, it is inevitable that, of the two memory cells formed in each of the element forming regions $AR_{11}$, $AR_{31}$, and $AR_{51}$, one that is at the outermost periphery side be set as a dummy cell.

Thus, in the method of manufacturing the semiconductor device according to the eighth preferred embodiment, at least a plurality of memory cells that are arranged in the outermost periphery of the memory cell array are set as dummy cells. This makes it possible to avoid beforehand degradation in performance and reliability of a semiconductor device caused by the doped channel regions 5 or the impurity-introduced regions 70 and 73 being not formed in desired locations.

While the invention has been shown and described in detail, the foregoing description is in all aspects illustrative and not restrictive. It is therefore understood that numerous other modifications and variations can be devised without departing from the scope of the invention.

The invention claimed is:

1. A method of manufacturing a semiconductor device, comprising the steps of:
    (a) forming a first insulating film on a main surface of a semiconductor substrate;
    (b) forming a conductive film on said first insulating film;
    (c) implanting ions of an impurity into said main surface through said conductive film and said first insulating film to form doped channel regions;
    (d) patterning said conductive film to form a gate electrode;
    (e) introducing an impurity into said main surface that is exposed from said gate electrode to form source-drain regions;
    (f) forming a recessed portion in said main surface; and
    (g) forming a thermal oxidation film on side surfaces and a bottom surface of said recessed portion by a thermal oxidation technique at about 900 to 115° C., using a single wafer-type lamp oxidation apparatus.

2. The method according to claim 1, further comprising the steps of:
    (h) forming a second insulating film on said conductive film, said step (h) being performed between said steps (b) and (c);
    (i) patterning said second insulating film, said step (i) being performed between said steps (c) and (d), wherein:
    in said step (c), said impurity is ion-implanted into said main surface through said second insulating film, said conductive film and said first insulating film, and
    in said step (d), said conductive film is patterned by an etching technique using said second insulating film patterned in said step (i) and an etch mask.

3. The method according to claim 1, wherein:
    in said step (a), said first insulating film is formed by using a lump oxidation apparatus at about 900 to 1100° C.

4. A method of manufacturing a semiconductor device, comprising the steps of:
    (a) forming a first insulating film on a main surface of a semiconductor substrate;
    (b) forming a conductive film on said first insulating film;
    (c) forming a recessed portion in said main surface;
    (d) forming a thermal oxidation film on side surfaces and a bottom surface of said recessed portion by a thermal oxidation technique at about 900 to 1150° C., using a single wafer-type lamp oxidation apparatus;
    (e) implanting ions of an impurity into said main surface through said conductive film and said first insulating film to form doped channel regions;
    (f) patterning said conductive film to form a gate electrode; and
    (g) introducing an impurity into said main surface that is exposed from said gate electrode to form source-drain regions.

* * * * *